(12) United States Patent
Ota

(10) Patent No.: US 10,811,544 B2
(45) Date of Patent: Oct. 20, 2020

(54) IMAGING DEVICE AND IMAGING SYSTEM

(71) Applicant: CANON KABUSHIKI KAISHA, Tokyo (JP)

(72) Inventor: Keisuke Ota, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/917,345

(22) Filed: Mar. 9, 2018

(65) Prior Publication Data

US 2018/0270405 A1 Sep. 20, 2018

(30) Foreign Application Priority Data

Mar. 17, 2017 (JP) .................................. 2017-052956

(51) Int. Cl.

| H01L 31/02 | (2006.01) |
|---|---|
| H04N 5/3745 | (2011.01) |
| H04N 5/235 | (2006.01) |
| H01L 31/107 | (2006.01) |
| H01L 27/146 | (2006.01) |

(52) U.S. Cl.
CPC ...... *H01L 31/02027* (2013.01); *H01L 27/146* (2013.01); *H01L 27/14634* (2013.01); *H01L 31/107* (2013.01); *H01L 31/1075* (2013.01); *H04N 5/2358* (2013.01); *H04N 5/37457* (2013.01); *H01L 27/1464* (2013.01)

(58) Field of Classification Search
CPC ............ H01L 27/146; H01L 27/14634; H01L 27/1464; H01L 31/02027; H01L 31/107; H01L 31/1075; H04N 5/235–243; H04N 5/2358; H04N 5/37457

See application file for complete search history.

(56) References Cited

U.S. PATENT DOCUMENTS

| 5,532,474 A | * | 7/1996 | Dautet | ............... | H03K 17/0416 |
|---|---|---|---|---|---|
| | | | | | 250/214 R |
| 7,723,694 B2 | * | 5/2010 | Frach | ..................... | G01T 1/1642 |
| | | | | | 250/370.11 |
| 7,859,575 B2 | | 12/2010 | Ota et al. | | |
| 8,189,086 B2 | | 5/2012 | Hashimoto et al. | | |
| 8,310,576 B2 | | 11/2012 | Hashimoto et al. | | |
| 8,553,119 B2 | | 10/2013 | Hashimoto et al. | | |
| 8,624,992 B2 | | 1/2014 | Ota et al. | | |
| 8,922,668 B2 | | 12/2014 | Ota | | |
| 9,900,539 B2 | | 2/2018 | Yamasaki et al. | | |

(Continued)

FOREIGN PATENT DOCUMENTS

| JP | 2008-287165 A | 11/2008 |
|---|---|---|
| JP | 2013-020972 A | 1/2013 |

*Primary Examiner* — Lin Ye
*Assistant Examiner* — Chriss S Yoder, III
(74) *Attorney, Agent, or Firm* — Venable LLP

(57) ABSTRACT

An imaging device includes a plurality of pixels each including a plurality of avalanche photodiodes, a setting unit configured to set the plurality of avalanche photodiodes to an active state or an inactive state separately, and a counter circuit that counts and outputs number of photons determined by the avalanche photodiode(s) set to the active state out of the plurality of avalanche photodiodes, wherein the imaging device is configured to change the number of avalanche photodiodes set to the active state out of the plurality of avalanche photodiodes in accordance with brightness of an object.

36 Claims, 13 Drawing Sheets

(56) References Cited

U.S. PATENT DOCUMENTS

| | | |
|---|---|---|
| 2010/0321532 A1 | 12/2010 | Hashimoto et al. |
| 2011/0050969 A1* | 3/2011 | Nishihara .................. G01J 1/44 |
| | | 348/296 |
| 2013/0015331 A1* | 1/2013 | Birk .......................... G01J 3/36 |
| | | 250/208.2 |
| 2016/0150176 A1 | 5/2016 | Hiyama et al. |
| 2017/0099448 A1 | 4/2017 | Minowa et al. |
| 2017/0212221 A1 | 7/2017 | Goden et al. |

* cited by examiner

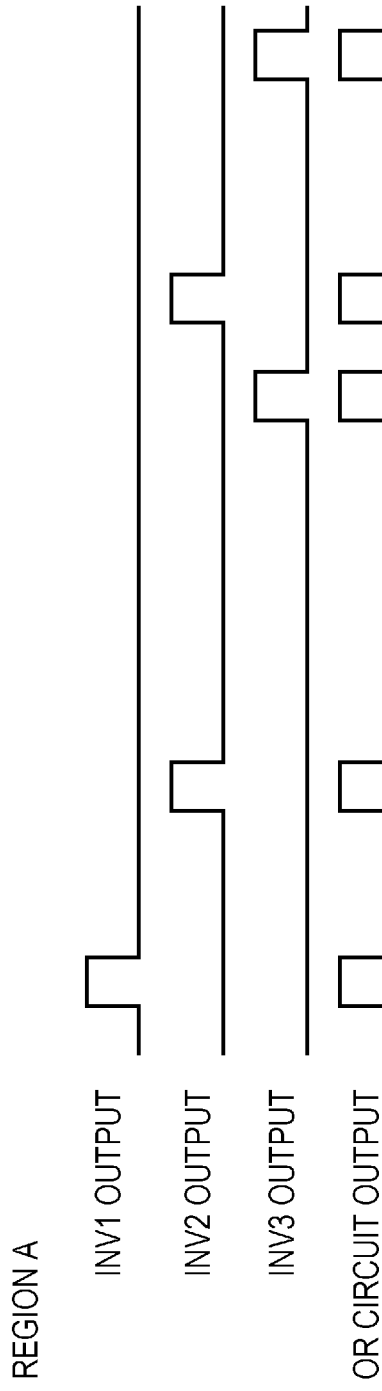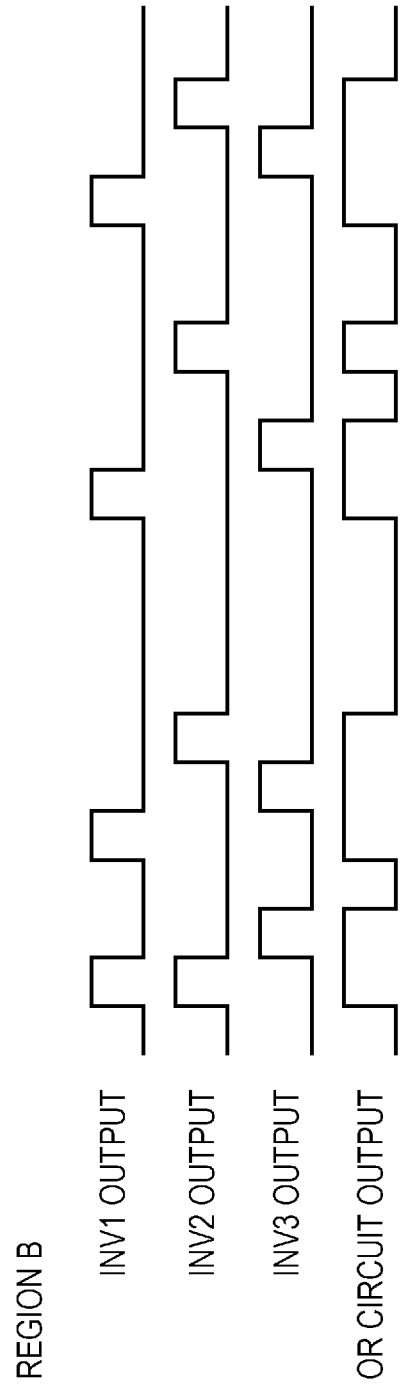

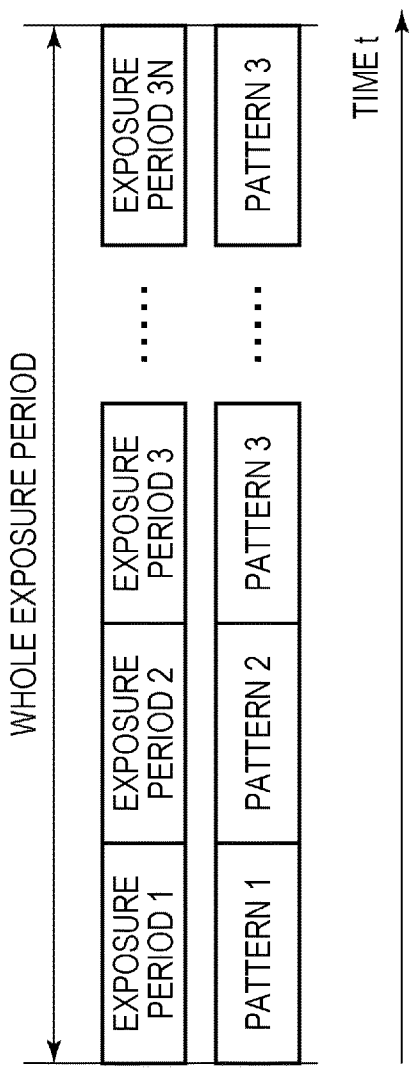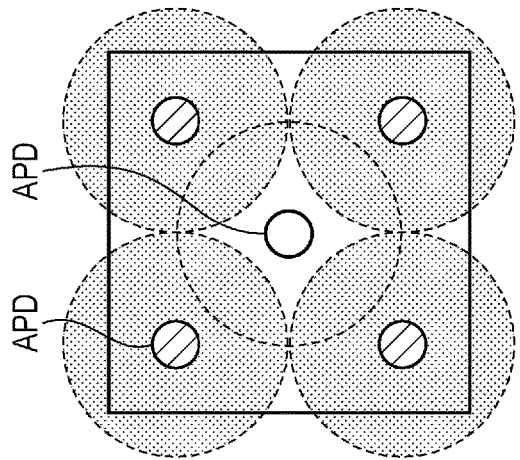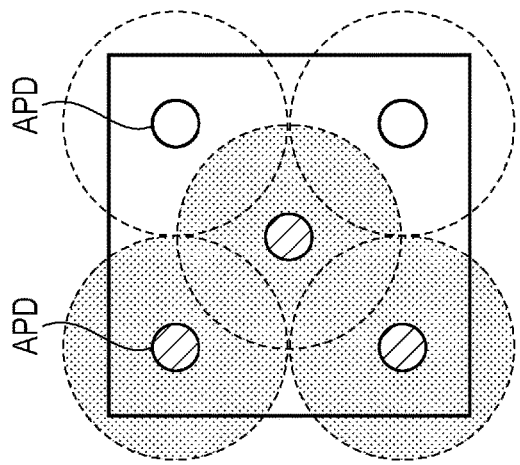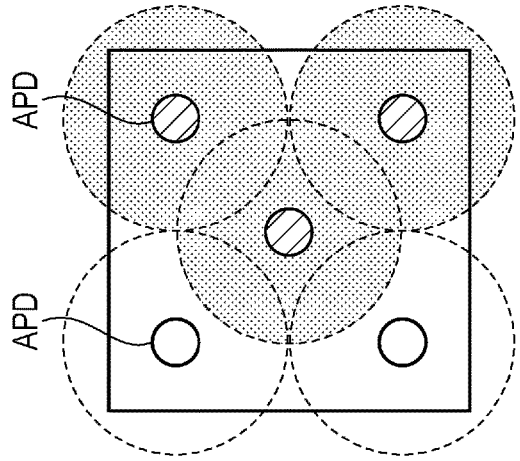

IMAGING DEVICE AND IMAGING SYSTEM

BACKGROUND OF THE INVENTION

Field of the Invention

The present invention relates to an imaging device and an imaging system

Description of the Related Art

In recent years, application of semiconductor devices that are able to detect a faint light in a level of a single photon is expected in a wide range of fields. In particular, a use of a photodetector element in which a signal corresponding to a single photon is larger than a noise at signal readout allows for so called photon-counting in which the brightness of an input light, which has been conventionally handled as continuous values, is accurately counted as a discrete value of the number of photons.

An example of photodetector elements that realize photon-counting may be an avalanche photodiode (hereafter, also referred to as "APD"). An APD can amplify the amount of signal charges excited by photons by around several times to million times by using an avalanche amplification phenomenon caused by an intense electric field induced at a p-n junction of a semiconductor. By utilizing a high gain of the avalanche amplification phenomenon, it is possible to amplify a faint light signal to be sufficiently greater than a readout noise and realize brightness resolution in the level of a single photon.

Japanese Patent Application Laid-Open No. 2013-020972 discloses an imaging device in which single-photon avalanche diodes (hereafter, also referred to as "SPAD") that cause the APD to operate in a Geiger mode are arranged in a two-dimensional manner. The imaging device disclosed in Japanese Patent Application Laid-Open No. 2013-020972 seeks improvement of the image quality by not using SPAD pixels which do not contribute to an optical signal or SPAD pixels which have a large dark count rate (DCR) noise representing noise in APDs.

While the SPAD is superior in detection of a faint light, however, the detection frequency of photons will be too high in a bright situation such as under a day light even when the light amount is reduced by using an aperture mechanism. Thus, in an imaging device with SPADs, it is difficult to support both capturing of a dark scene and capturing of a bright scene by the same pixels.

SUMMARY OF THE INVENTION

An object of the present invention is to provide an imaging device with SPADs that is able to easily control photoelectric change gain in a pixel and an imaging system using the imaging device.

According to an aspect of the present invention, there is provided an imaging device including a plurality of pixels each including a plurality of avalanche photodiodes, a setting unit configured to separately set the plurality of avalanche photodiodes to an active state or an inactive state, and a counter circuit that counts and outputs number of photons determined by the avalanche photodiode(s) set to the active state out of the plurality of avalanche photodiodes, wherein the imaging device is configured to change the number of avalanche photodiodes set to the active state out of the plurality of avalanche photodiodes in accordance with brightness of an object.

According to another aspect of the present invention, there is provided a method of driving an imaging device including a plurality of pixels each including a plurality of avalanche photodiodes, a setting unit configured to set the plurality of avalanche photodiodes to an active state or an inactive state separately, and a counter circuit that counts and outputs number of photons determined by the avalanche photodiode(s) set to the active state out of the plurality of avalanche photodiodes, the method includes, in the plurality of pixels, setting the number of avalanche photodiodes set to the active state out of the plurality of avalanche photodiodes to the same number in accordance with brightness of an object.

Further features of the present invention will become apparent from the following description of exemplary embodiments with reference to the attached drawings.

BRIEF DESCRIPTION OF THE DRAWINGS

FIG. 7A and FIG. 7B are graphs illustrating temporal changes of output voltages of inverter circuits and an OR circuit.

FIG. 11A, FIG. 11B, FIG. 11C, and FIG. 11D are diagrams illustrating a method of driving an imaging device according to a fourth embodiment of the present invention.

DESCRIPTION OF THE EMBODIMENTS

Preferred embodiments of the present invention will now be described in detail in accordance with the accompanying drawings.

First Embodiment

Figure 1:
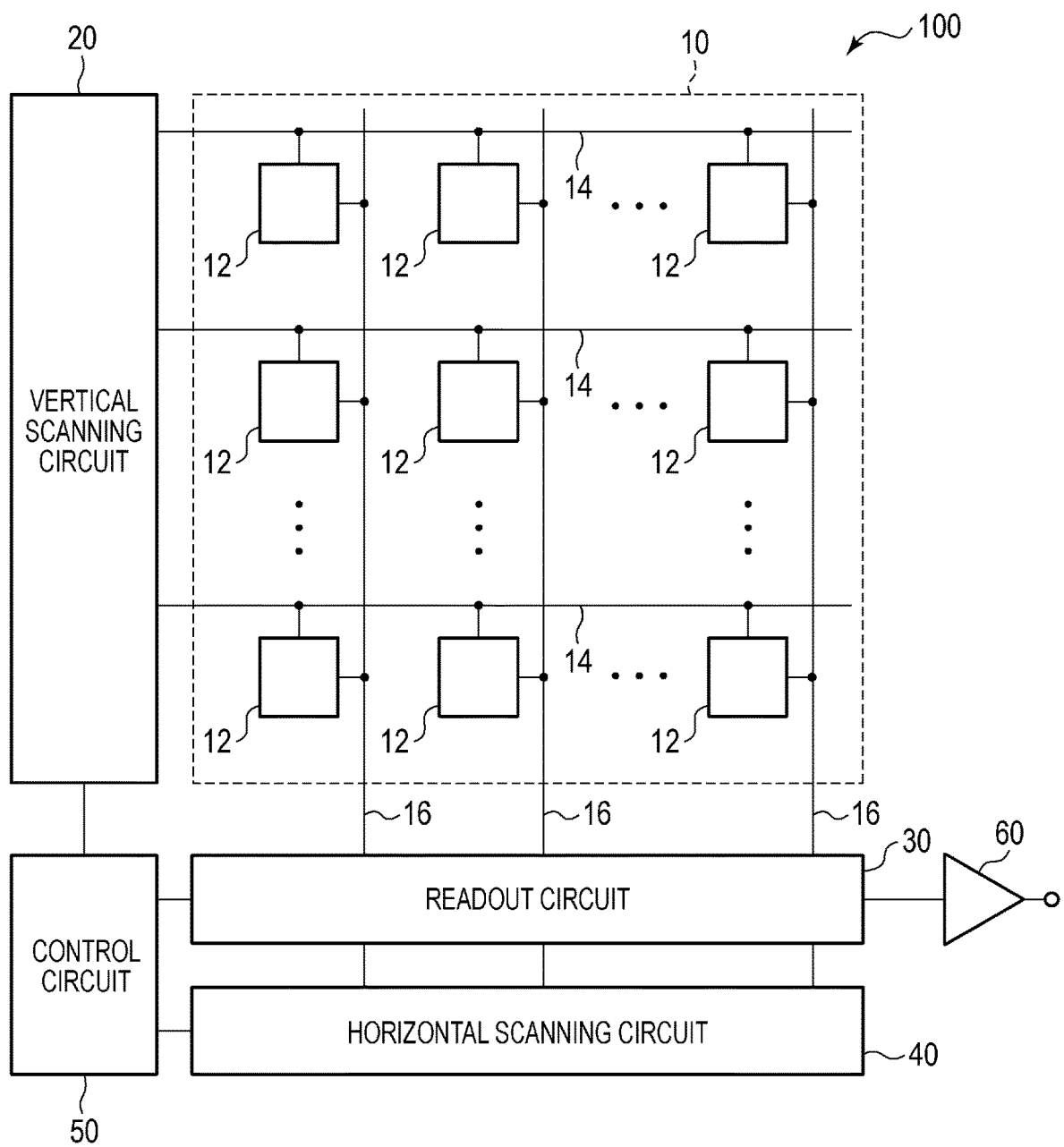
FIG. 1 is a block diagram illustrating a general configuration of an imaging device according to a first embodiment of the present invention.
Figure 2:
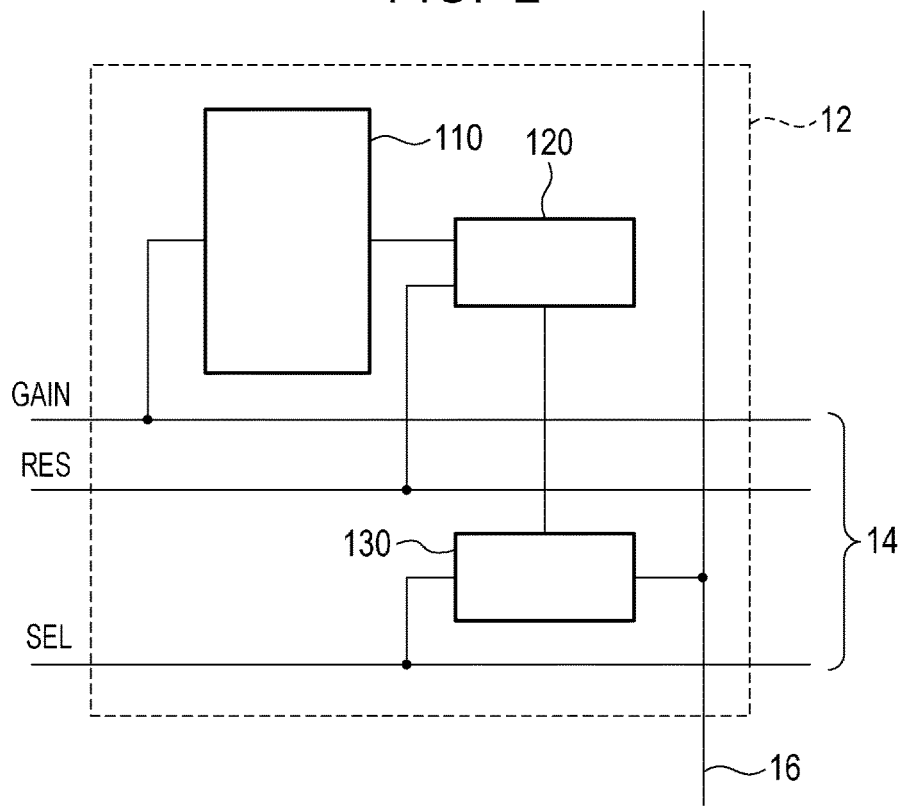
FIG. 2 is a block diagram illustrating a general configuration of a pixel of the imaging device according to the first embodiment of the present invention.
Figure 3:
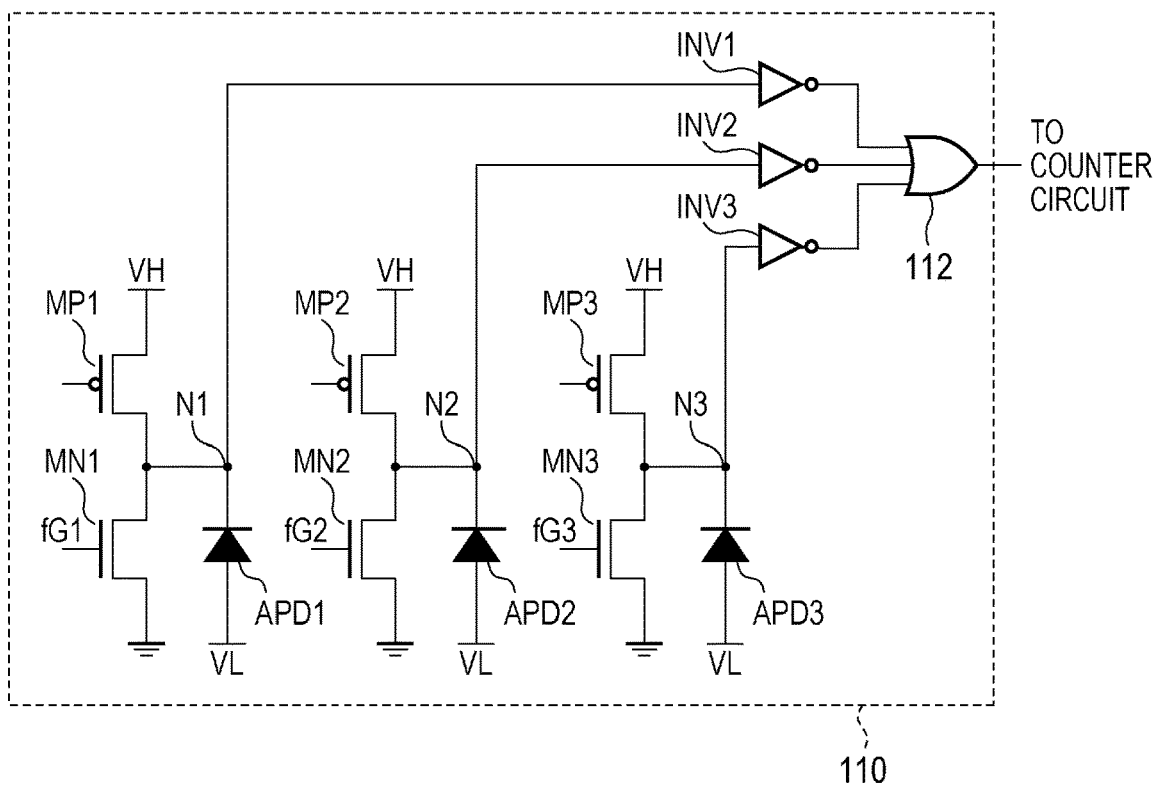
FIG. 3 is a circuit diagram illustrating a configuration example of a photoelectric conversion signal generation unit of the pixel of the imaging device according to the first embodiment of the present invention.
Figure 4:
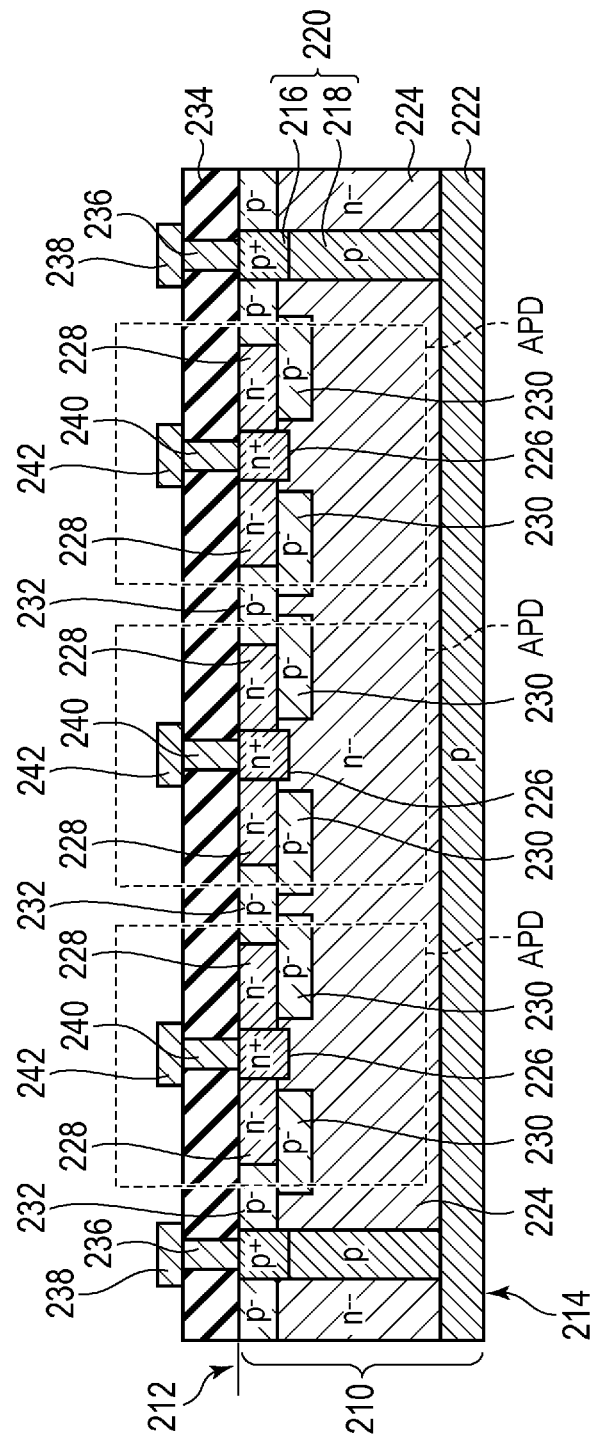
FIG. 4 is a cross-sectional view illustrating a general configuration of avalanche photodiodes of the pixel of the imaging device according to the first embodiment of the present invention.
Figure 5:
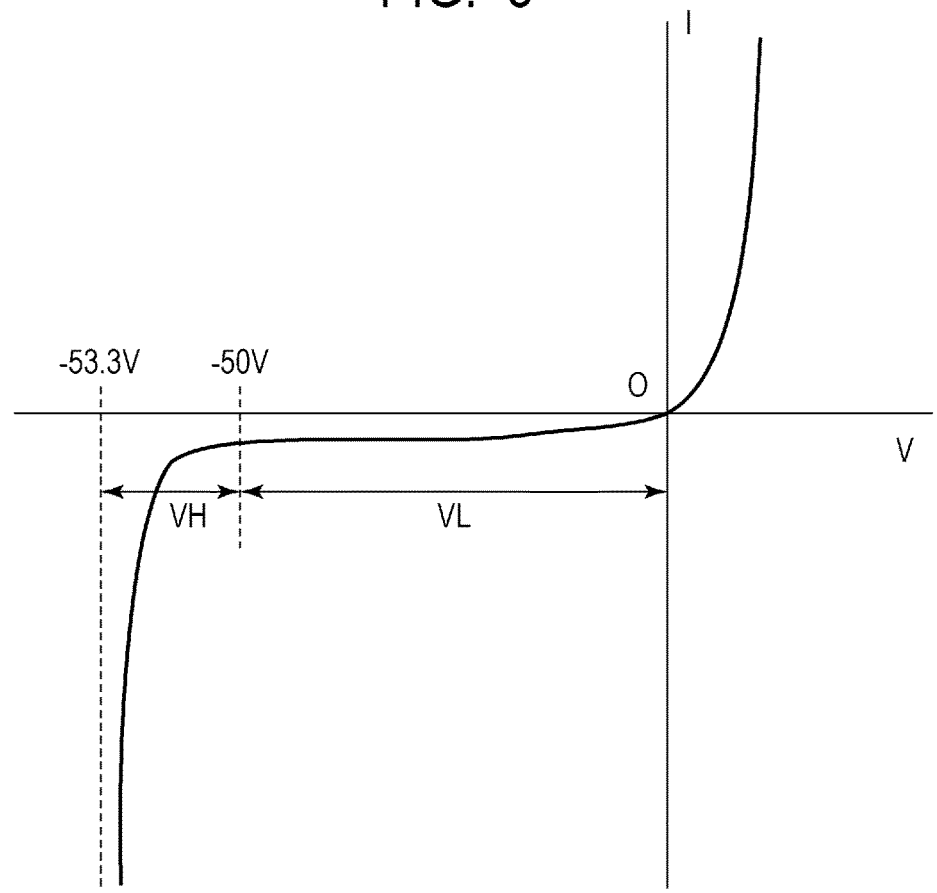
FIG. 5 is a graph illustrating an example of a current-to-voltage characteristic of an avalanche photodiode.
Figure 6:
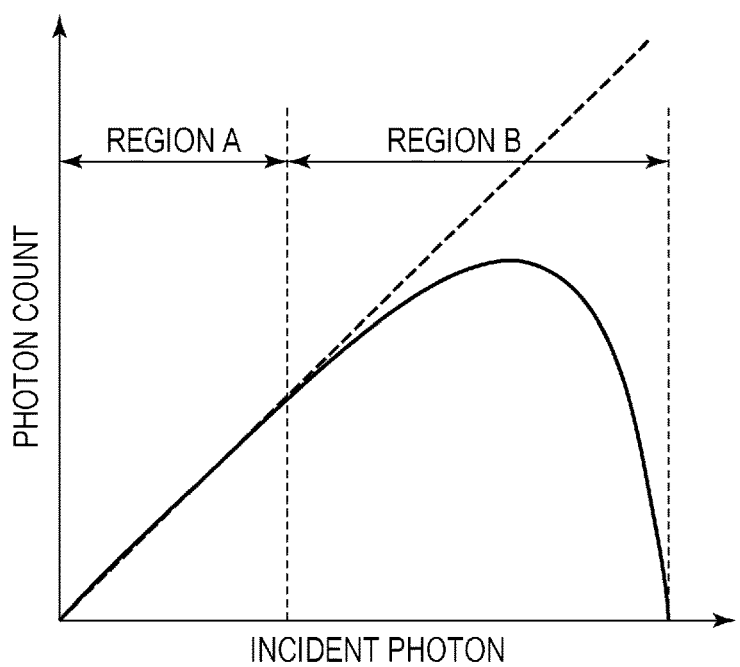
FIG. 6 is a graph illustrating a relationship between the number of actually incident photons and the number of counted photons.
Figure 8:
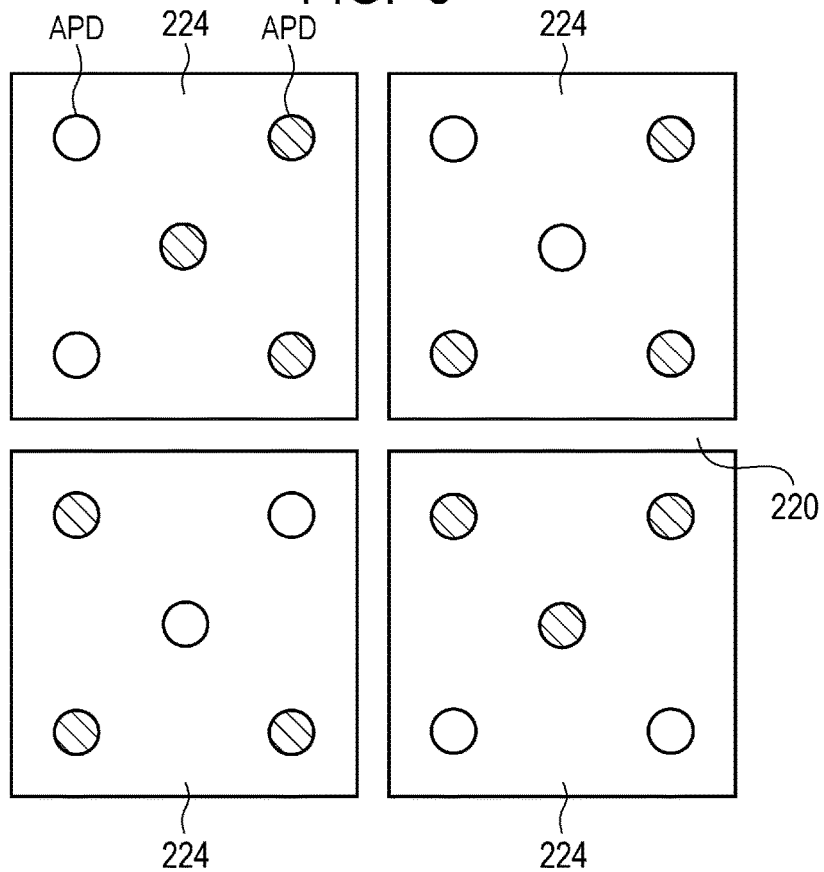
FIG. 8 is a top view of the pixel of the imaging device according to the first embodiment of the present invention.

An imaging device and a method of driving the same according to a first embodiment of the present invention will be described with reference to FIG. 1 to FIG. 8. FIG. 1 is a block diagram illustrating a general configuration of an imaging device according to the present embodiment. FIG. 2 is a block diagram illustrating a general configuration of a pixel of the imaging device according to the present embodiment. FIG. 3 is a circuit diagram illustrating a configuration example of a photoelectric conversion signal generation unit of the pixel of the imaging device according to the present embodiment. FIG. 4 is a cross-sectional view illustrating a general configuration of avalanche photodiodes of the pixel of the imaging device according to the present embodiment. FIG. 5 is a graph illustrating an example of a current-to-voltage characteristic of an avalanche photodiode. FIG. 6 is a graph illustrating a relationship between the number of actually incident photons and the number of counted photons. FIG. 7A and FIG. 7B are graphs illustrating temporal change of output voltages of inverter circuits and an OR circuit. FIG. 8 is a top view of the pixel of the imaging device according to the present embodiment.

As illustrated in FIG. 1, the imaging device 100 according to the present embodiment includes a pixel region 10, a vertical scanning circuit 20, a column readout circuit 30, a horizontal scanning circuit 40, a control circuit 50, and an output circuit 60.

In the pixel region 10, a plurality of pixels 12 are provided arranged in a matrix over a plurality of rows by a plurality of columns. On each of the rows of a pixel array in the pixel region 10, a control signal line 14 is arranged extending in the row direction (the horizontal direction in FIG. 1). The control signal line 14 is connected to respective pixels 12 aligned in the row direction, which is a signal line common to these pixels 12. Further, on each of the columns of the pixel array in the pixel region 10, a vertical output line 16 is arranged extending in the column direction (the vertical direction in FIG. 1). The vertical output line 16 is connected to respective pixels 12 aligned in the column direction, which is a signal line common to these pixels 12.

The number of pixels 12 forming the pixel region 10 is not limited in particular. For example, the pixel region 10 may be formed of several thousand rows by several thousand columns of the pixels 12 as seen in a general digital camera. Alternatively, the pixel region 10 may be formed of a plurality of pixels 12 aligned in one row or one column. Alternatively, the pixel region 10 may be formed of a single pixel 12.

The control signal line 14 on each row is connected to the vertical scanning circuit 20. The vertical scanning circuit 20 is a circuit unit that supplies, to the pixels 12 via the control signal lines 14, control signals for driving readout circuits in the pixels 12 when reading out pixel signals from the pixels 12. One end of the vertical output line 16 on each column is connected to the column readout circuit 30. Pixel signals read out from the pixels 12 are input to the column readout circuit 30 via the vertical output lines 16. The column readout circuit 30 is a circuit unit that performs predetermined signal processing, for example, signal processing such as an amplification process or an analog-to-digital (AD) conversion process on the pixel signals read out from the pixels 12. The column readout circuit 30 may include a differential amplifier circuit, a sample-and-hold circuit, an AD conversion circuit, or the like.

The horizontal scanning circuit 40 is a circuit unit that supplies, to the column readout circuit 30, control signals for transferring the pixel signal processed in the column readout circuit 30 to the output circuit 60 sequentially on a column basis. The control circuit 50 is a circuit unit that supplies control signals for controlling operations and the timings of the operations of the vertical scanning circuit 20, the column readout circuit 30, and the horizontal scanning circuit 40. The output circuit 60 is a circuit unit that is formed of a buffer amplifier, a differential amplifier, or the like and outputs the pixel signals read out from the column readout circuit 30 to a signal processing unit outside the solid state imaging device 100.

FIG. 2 is a block diagram illustrating a general configuration of the pixel 12. As illustrated in FIG. 2, each of the pixels 12 includes a photoelectric conversion signal generation unit 110, a counter circuit 120, and a select circuit 130. The photoelectric conversion signal generation unit 110 is connected to the counter circuit 120. The counter circuit 120 is connected to the vertical output line 16 via the select circuit 130.

In the configuration example of FIG. 2, the control signal lines 14 on each row include a reset signal line RES, a select signal line SEL, and a gain control signal line GAIN. The reset signal line RES is connected to the counter circuits 120 of the pixels 12 belonging to the associated row, respectively. The select signal line SEL is connected to the select circuits 130 of the pixels 12 belonging to the associated row, respectively. The gain control signal line GAIN is connected to the photoelectric conversion signal generation unit 110 of the pixels 12 belonging to the associated row, respectively. The gain control signal line GAIN may be configured to be supplied with a gain control signal from a control circuit (not illustrated) other than the vertical scanning circuit 20. Further, the gain control signal line GAIN connected to the photoelectric conversion signal generation units 110 of a plurality of pixels 12 belonging to the same row is not necessarily required to be the common signal line.

FIG. 3 is a circuit diagram illustrating a configuration example of the photoelectric conversion signal generation unit 110. The photoelectric conversion signal generation unit 110 includes a plurality of pixel elements each including an avalanche photodiode APD, a p-channel MOS transistor MP, an n-channel MOS transistor MN, and an inverter circuit INV and includes an OR circuit 112. FIG. 3 illustrates the photoelectric conversion signal generation unit 110 including three pixel elements of a first pixel element, a second pixel element, and a third pixel element. Note that the number of pixel elements included in the photoelectric conversion signal generation unit 110 is not limited in particular.

The first pixel element includes an avalanche photodiode APD1, a p-channel MOS transistor MP1, an n-channel MOS transistor MN1, and an inverter circuit INV1. The anode of the avalanche photodiode APD1 is connected to a power source that supplies a voltage VL. The cathode of the avalanche photodiode APD1 (node N1) is connected to the drain of the p-channel MOS transistor MP1, the drain of the n-channel MOS transistor MN1, and the input terminal of the inverter circuit INV1. The source of the p-channel MOS transistor MP1 is connected to a power source that supplies a voltage VH whose potential is higher than the voltage VL. The source of the n-channel MOS transistor MN1 is grounded. The output terminal of the inverter circuit INV1 is connected to one of the input terminals of the OR circuit 112. The output terminal of the OR circuit 112, which also serves as the output terminal of the photoelectric conversion signal generation unit 110, is connected to the counter circuit 120.

Similarly, the second pixel element includes an avalanche photodiode APD2, a p-channel MOS transistor MP2, an n-channel MOS transistor MN2, and an inverter circuit INV2. The anode of the avalanche photodiode APD2 is connected to a power source that supplies a voltage VL. The cathode of the avalanche photodiode APD2 (node N2) is connected to the drain of the p-channel MOS transistor MP2, the drain of the n-channel MOS transistor MN2, and the input terminal of the inverter circuit INV2. The source of the p-channel MOS transistor MP2 is connected to a power source that supplies a voltage VH whose potential is higher than the voltage VL. The source of the n-channel MOS transistor MN2 is grounded. The output terminal of the inverter circuit INV2 is connected to one of the input terminals of the OR circuit 112.

Similarly, the third pixel element includes an avalanche photodiode APD3, a p-channel MOS transistor MP3, an n-channel MOS transistor MN3, and an inverter circuit INV3. The anode of the avalanche photodiode APD3 is connected to a power source that supplies a voltage VL. The cathode of the avalanche photodiode APD3 (node N3) is connected to the drain of the p-channel MOS transistor MP3, the drain of the n-channel MOS transistor MN3, and the input terminal of the inverter circuit INV3. The source of the p-channel MOS transistor MP3 is connected to a power source that supplies a voltage VH whose potential is higher than the voltage VL. The source of the n-channel MOS transistor MN3 is grounded. The output terminal of the inverter circuit INV3 is connected to one of the input terminals of the OR circuit 112.

In the case of the configuration example illustrated in FIG. 3, the gain control signal line GAIN connected to the photoelectric conversion signal generation unit 110 includes three signal lines that supply gain control signals φG1, φG2, and φG3 to the gates of the n-channel MOS transistors MN1, MN2, and MN3, respectively.

Each of the pixel elements, the p-channel MOS transistor MP functions as a quenching resistor of the avalanche photodiode APD. Further, the n-channel MOS transistor MN functions as a gain control switch that separately controls the gain (an active state or an inactive state) of the avalanche photodiode APD. The inverter circuit INV shapes a waveform of a signal output from the avalanche photodiode APD into a pulse waveform.

The imaging device according to the present embodiment can be formed by attaching a substrate in which the avalanche photodiode APDs are provided and a substrate in which other components than the avalanche photodiode APDs are provided as an example (see a fifth embodiment). Other components may include peripheral circuits such as the vertical scanning circuit 20, the column readout circuit 30, the horizontal scanning circuit 40, the control circuit 50, the output circuit 60, and the like in addition to the components of the pixel 12 other than the avalanche photodiode APD. FIG. 4 illustrates a cross-sectional view of a substrate in which the avalanche photodiodes APD are provided of these two substrates.

The avalanche photodiode APD of each pixel 12 is formed in a semiconductor substrate 210. The semiconductor substrate 210 is an n-type silicon substrate, for example. The semiconductor substrate 210 includes a first face 212 and a second face 214 opposing to the first face 212. For example, the first face 212 is a front face of the semiconductor substrate 210, and the second face 214 is a back face of the semiconductor substrate 210.

In the semiconductor substrate 210, n-type semiconductor regions 224 are provided. The n-type semiconductor regions 224 are divided by isolation portions 220 into regions each corresponding to one of the pixels 12. In each of the n-type semiconductor regions 224 divided by the isolation portions 220, a plurality of avalanche photodiodes APD included in each pixel 12 are arranged.

The isolation portion 220 includes a p-type semiconductor region 216 in contact with the first face 212 of the semiconductor substrate 210 and a p-type semiconductor region 218 arranged in contact with the p-type semiconductor region 216 on the second face 214 side and is arranged so as to surround each n-type semiconductor region 224 in a planar view. The second face 214 side of the p-type semiconductor region 218 is in contact with the p-type semiconductor region 222 provided in contact with the second face 214 of the semiconductor substrate 210.

Note that, while the example in which the n-type semiconductor region 224 in which a plurality of avalanche photodiodes APD are arranged in each pixel 12 is isolated by p-n junction isolation is illustrated here, other element isolation methods may be used for isolation. Other element isolation methods may be a shallow trench isolation (STI) method, a deep trench isolation (DTI) method, a local oxidation of silicon (LOCOS) method, or the like, for example.

In each n-type semiconductor region 224 defined by the isolation portions 220, a plurality of avalanche photodiodes APD included in one pixel 12 are arranged. FIG. 4 illustrates three avalanche photodiodes APD arranged in the n-type semiconductor region 224.

Each of the avalanche photodiodes APD includes n-type semiconductor regions 226 and 228 and p-type semiconductor regions 230 and 232. The n-type semiconductor region 226 is arranged in contact with the first face 212 of the semiconductor substrate 210. The n-type semiconductor region 228 is arranged in contact with the first face 212 of the semiconductor substrate 210 so as to surround the n-type semiconductor region 226. The p-type semiconductor region 230 is arranged in contact with the bottom of the n-type semiconductor region 228. The p-type semiconductor region 232 is arranged in contact with the first face 212 of the semiconductor substrate 210 between the n-type semiconductor regions of the adjacent avalanche photodiodes APD.

In this example, the impurity concentration of the n-type semiconductor region 226 is higher than the impurity concentration of the n-type semiconductor region 228. Further, the impurity concentration of the n-type semiconductor region 228 is higher than the impurity concentration of the n-type semiconductor region 224. The impurity concentration of the p-type semiconductor region 216 is higher than the impurity concentrations of the p-type semiconductor region 218 and the p-type semiconductor region 222. Further, the impurity concentrations of the p-type semiconductor region 218 and the p-type semiconductor region 222 are higher than the impurity concentrations of the p-type semiconductor regions 230 and 232.

A sufficient higher impurity concentration of the n-type semiconductor region 226 allows for a higher electric field of a depletion layer occurring in the n-type semiconductor region 226. The n-type semiconductor region 228 having a lower concentration than the n-type semiconductor region 226 has a function of an electric field mitigation region for not causing the electric filed concentration region of the n-type semiconductor region 226 to expand to other regions. The p-type semiconductor regions 230 and 232 form a potential valley for guiding charges (electrons) occurring inside the n-type semiconductor region 224 to the n-type semiconductor region 224. The n-type semiconductor region 224 is a photoelectric conversion region that generates carriers from a photon incidence.

On the semiconductor substrate 210 in which the avalanche photodiodes APD are provided, an insulating film 234 is provided. On the insulating film 234, interconnections 238 connected to the p-type semiconductor regions 216 are provided via contact plugs 236, and interconnections 242 connected to the n-type semiconductor regions 226 are provided via contact plugs 240. The voltage VL is supplied to the p-type semiconductor regions 216 via the interconnections 238 and the contact plugs 236. The n-type semiconductor regions 226 are connected to the nodes N of the circuit illustrated in FIG. 3 via the contact plugs 240 and the interconnections 242.

Next, a method of driving the imaging device according to the present embodiment will be described with an example of the case of the circuit configuration of FIG. 3.

The voltage VH and the voltage VL are set to be able to apply a reverse bias voltage that is sufficient for the avalanche photodiode APD to operate in the Geiger mode. As an example here, it is assumed that the avalanche photodiode APD has a current-to-voltage characteristic as illustrated in FIG. 5. The reverse breakdown voltage of the avalanche photodiode APD illustrated in FIG. 5 occurs between −50 V and −53.3 V. That is, while avalanche amplification does not occur in this avalanche photodiode APD when a reverse bias voltage of around −50 V is applied, avalanche amplification occurs when a reverse bias voltage greater than around −50 V is applied. Further, when a reverse bias voltage greater than around −53.3 V is applied, this causes an operation in a so-called Geiger mode in which the gain of avalanche amplification becomes significantly higher.

In the present embodiment, each avalanche photodiode APD operates in the Geiger mode, that is, is used as a single-photon avalanche diode (SPAD). Thus, for example, −50 V is applied as the voltage VL to the anode of the avalanche photodiode APD, and, for example, +3.3 V is applied as the voltage VH to the source of the p-channel MOS transistor MP.

Typically, the same voltage as the voltage applied to the source is applied to the gate of the p-channel MOS transistor MP serving as a quenching resistor. This causes the p-channel MOS transistor MP to operate as a resistance element whose resistance is determined by the dimension of the transistor. It is possible to intentionally set the voltage applied to the gate of the p-channel MOS transistor MP lower than the voltage applied to the source to utilize the p-channel MOS transistor MP as a resistance element having a higher resistance. The gate voltage of the p-channel MOS transistor MP can be set as appropriate so that a desired quenching resistance can be obtained.

The n-channel MOS transistor MN as a gain control switch is controlled by the gain control signal φG supplied to the gate thereof. The n-channel MOS transistor MN is in an on-state when the gain control signal φG is at a high level, and is in an off-state when gain control signal φG is at a low level.

When the n-channel MOS transistor MN is in an off-state, in an initial state where no current flows, a reverse bias voltage of 53.3 V, which is the potential difference between the voltage VH and the voltage VL, is applied to the avalanche photodiode APD. Although this reverse bias voltage is higher than the breakdown voltage and is sufficient to cause avalanche amplification, no avalanche amplification occurs in a state where no carrier to be a seed is present, and thus no current flows in the avalanche photodiode APD.

Once photons enter the second face 214 side of the semiconductor substrate 210 in this state, the photons are absorbed in the n-type semiconductor region 224, and electron and hole pairs are generated. Holes of these pairs are drained via the p-type semiconductor regions 216, 218, 222, 230, and 232. On the other hand, electrons are guided to the n-type semiconductor region 226 along the potential valley between the p-type semiconductor regions 230. These electrons are accelerated by the electric field in a part of the n-type semiconductor region 226 to cause avalanche amplification, and the avalanche photodiode APD operates in the Geiger mode.

A large current flows in the avalanche photodiode APD ensuing avalanche amplification, and thereby the potential of the node N (nodes N1, N2, N3) that is the terminal on the cathode side of the avalanche photodiode APD decreases and the avalanche amplification stops. Carriers at the node N are gradually drained via the p-channel MOS transistor MP connected as a load, and the voltage of the node N returns to the initial voltage (quenching operation).

In such a way, in response to a photon incidence, the potential of the cathode (node N) of the avalanche photodiode APD changes from a carrier waiting state to a state where the voltage has decreased due to a flow of a large current in a Geiger mode and then returns to the carrier waiting state. By shaping this voltage waveform at the node N by the inverter circuit INV, a signal pulse starting from the arrival time of one photon is generated. By counting the number of these signal pulses, so-called photon-counting can be performed.

On the other hand, when the n-channel MOS transistor MN is in an on-state, the potential of the cathode (node N) of the avalanche photodiode APD is 0 V, and the reverse bias voltage applied to the avalanche photodiode APD is 50 V that is a voltage below the breakdown voltage. In this state, even when electrons occur due to a photon incidence, these electrons do not cause avalanche amplification and are drained via the p-channel MOS transistor MP. Since a current due to elementary charges is sufficiently small and a voltage drop at the p-channel MOS transistor MP is sufficiently small, the threshold value of the inverter circuit INV is not exceeded and no signal pulse is output.

In such a way, the n-channel MOS transistor MN is a switch that switches the voltage applied to the avalanche photodiode APD to a voltage that is higher than the breakdown voltage or less than or equal to the breakdown voltage of the avalanche photodiode APD.

The avalanche photodiodes APD1, APD2, and APD3 are able to detect photons independently of each other, and signal pulses are output from the inverter circuits INV1, INV2, and INV3, respectively. The outputs of the inverter circuits INV1, INV2, and INV3 are bundled into one by the OR circuit 112 and output to the counter circuit 120. Thereby, in the counter circuit 120, the total number of photons determined by the avalanche photodiodes APD1, APD2, and APD3 is counted. The count value counted by the counter circuit 120 is then output to the vertical output line 16 with the select circuit 130 operating in accordance with the select signal from the vertical scanning circuit 20.

Next, a photon-counting operation in the imaging device according to the present embodiment will be described more specifically by using FIG. 6 to FIG. 7B. Note that, in the operation described below, it is assumed that the gain control signals φG of the n-channel MOS transistors MN1, MN2, and MN3 as gain control switches are at a low level, and the avalanche photodiodes APD1, APD2, and APD3 operate in the Geiger mode.

FIG. 6 is a graph illustrating the relationship between the number of incident photons and the photon count by the counter circuit 120. As illustrated in FIG. 6, when the number of incident photons is small, the number can be accurately counted by the counter circuit 120 (region A). As the number of incident photons increases, however, the photon count by the counter circuit 120 becomes smaller than the number of actual incident photons. When a light intensity is extremely high and thus the number of incident photons is significantly large, photon-counting by the counter circuit 120 cannot be made, and thus the photon count becomes zero (region B).

The reason for occurrence of the phenomenon as illustrated in FIG. 6 will be described by using FIG. 7A and FIG. 7B. FIG. 7A and FIG. 7B are graphs illustrating temporal changes of output voltages of the inverter circuits INV1, INV2, and INV3 and the OR circuit 112. FIG. 7A illustrates a case corresponding to the region A of FIG. 6, and FIG. 7B illustrates a case corresponding to the region B of FIG. 6.

In the case of the region A, since the number of incident photons is relatively small, there is a sufficiently smaller probability that the timings of photons being detected by the avalanche photodiodes APD1, APD2, and APD3 temporally overlap with each other as illustrated in FIG. 7A. Thus, the signal pulses output from the inverter circuits INV1, INV2, and INV3 do not temporally overlap with each other, and the OR circuit 112 can output signal pulses the number of which corresponds to the number of photons determined by the avalanche photodiodes APD1, APD2, and APD3. For example, in the example of FIG. 7A, while the number of photons determined by the avalanche photodiodes APD1, APD2, and APD3 (the number of output pulses of the inverter circuits INV1, INV2, and INV2) is five, the number of signal pluses output from the OR circuit 112 is also five.

On the other hand, in the case of the region B, since the number of incident photons is large, the timings of photons being detected by the avalanche photodiodes APD1, APD2, and APD3 may temporally overlap with each other. Further, a next incident photon occurs before a signal pulse of the OR circuit 112 completely falls, and thereby signal pulses which have to be detected as a plurality of signal pulses may overlap with each other and be detected as a single continuous signal pulse. For example, in the example of FIG. 7B, while the number of photons determined by the avalanche photodiodes APD1, APD2, and APD3 (the number of output pulses of the inverter circuits INV1, INV2, and INV2) is 12, the number of signal pluses output from the OR circuit 112 decreases to five.

With a further intense light, in each of the inverter circuits INV, a photon is again detected after a signal pulse rises and before the signal pulse falls, and thereby the next signal pulse may be continuous thereto. When such a phenomenon occurs in each of the inverter circuits INV, this results in a state where any of the outputs of the inverter circuits INV1, INV2, and INV3 is at a high level all the time, and thus the output of the OR circuit 112 does not change from the high level. As a result, signal pulses cannot be counted in the counter circuit 120, which causes the photon count to be zero.

In such a way, in the photon-counting, the arrival frequency of detectable photons (equal to the light intensity) is determined by a period from the time when a photon is detected to the time when a next photon can be detected (called "dead time").

In order to realize an ultrasensitive imaging device that can detect a photon even in a significantly dark situation such as under the moon light or star lights, it is conceivable to provide the pixels 12 that are large to some extent. With the imaging device configured as such, however, the photon detection frequency becomes too high in a bright situation such as under day light even when the light amount is reduced by an aperture mechanism, and thus the photon-counting cannot be made.

In terms of the above, in the imaging device according to the present embodiment, a gain control switch is provided in each pixel element of the pixel 12, and the operation states of the plurality of avalanche photodiodes APD included in a pixel can be set separately. The gain control switches (n-channel MOS transistors MN) are a setting unit adapted to set a plurality of avalanche photodiodes to the active state or the inactive state in a separate manner.

For example, in the circuit of FIG. 3, the gain control signal φG2 is set to a low level, and the gain control signals φG1 and φG3 are set to a high level. This allows the avalanche photodiode APD2 to be set to a voltage condition which causes avalanche amplification and the avalanche photodiodes APD1 and APD3 to be set to a voltage condition which does not cause avalanche amplification. That is, the avalanche photodiode APD2 enters a state for responding to a light (active state), and the avalanche photodiodes APD1 and APD3 enter a state for not responding to a light (inactive state). Thereby, signals based on carriers guided to the n-type semiconductor regions 226 of the avalanche photodiodes APD1 and APD3 do not contribute to photon-counting.

For example, in the example of FIG. 7B, both the numbers of signal pulses output from the inverter circuits INV1 and INV3 are zero. As a result, the number of signal pulses output from the OR circuit 112 is equal to four that is the number of signal pulses output from the inverter circuit INV2, which allows for accurate photon-counting.

Causing some of the plurality of avalanche photodiodes APD to enter the inactive state is equal to switching the pixel to be a small-sized pixel having a low sensitivity. That is, in a very dark situation with a faint light, all the avalanche photodiodes APD are controlled to operate in the Geiger mode so that incident photons can be detected without loss allowing for ultrasensitive capturing. On the other hand, in a bright situation with an intense light such as daytime, some avalanche photodiodes APD are controlled to the inactive state to perform capturing with low sensitivity. In this case, light amount control using an aperture may be combined. By doing so, the light amount range enabling capturing can be expanded.

In terms of improvement of the in-plane uniformity of the sensitivity, it is desirable that the number of avalanche photodiodes APD set in the active state be the same over all the pixels 12. The scheme for having the same number of avalanche photodiodes APD set in the active state in all the pixels 12 is not limited in particular. For example, when the configuration example illustrated in FIG. 3, there may be a scheme in which three signal lines that supply the gain control signals φG1, φG2, and φG3 to the re-channel MOS transistors MN1, MN2, and MN3 are arranged as common signal lines to respective pixels 12. The signal lines that supply the gain control signals φG1, φG2, and φG3 may be separate signal lines for respective pixels 12, and the gain control signals φG1, φG2, and φG3 may be set so that the total number of the avalanche photodiodes APD set to the active state is the same over the entire pixels 12.

Note that, while the example in which the number of avalanche photodiodes APD included in one pixel 12 is three has been described in the present embodiment, the number of avalanche photodiodes APD included in one pixel 12 is not limited in particular as long as it is plural. Further, the relationship between the number of avalanche photodiodes APD in the active state and the number of avalanche photodiodes APD in the inactive state can be selected as appropriate in accordance with capturing conditions.

The arrangement of the avalanche photodiodes APD set in the active state may be different for each pixel 12. FIG. 8 is a plan view of the semiconductor substrate 210 viewed from the first face 212 side, which illustrates a state where the n-type semiconductor regions 224 of four pixels 12 are arranged adjacent via the isolation portions 220. Five avalanche photodiodes APD are arranged in each of the n-type semiconductor regions 224 of respective pixels 12. In FIG. 8, hatched circles represent the avalanche photodiodes APD in the active state, and white circles represent the avalanche photodiodes APD in the inactive state. In any of the pixels 12, three of the five avalanche photodiodes APD are in the active state, and two of the five avalanche photodiodes APD are in the inactive state. However, the positions of the avalanche photodiodes APD in the active state are different for respective pixels 12. While it is desirable that the number of avalanche photodiodes APD set in the active state be the same in obtaining the same sensitivity of the pixels 12, the positions of the avalanche photodiodes APD set in the active state are not limited in particular.

When the imaging device 100 is mounted in an imaging system such as a digital single lens reflex camera, a control signal in accordance with the brightness of an object is supplied to the imaging device 100 from the imaging system side. In this case, for example, the control circuit 50 functions as a control signal receiving unit that receives the control signal and controls the number of the avalanche photodiodes APD set in the active state in accordance with the control signal.

As discussed above, according to the present embodiment, since each pixel is formed of a plurality of avalanche photodiodes and the plurality of avalanche photodiodes are separately set to the active state or the inactive state, the flexibility of setting of the photoelectric conversion gain can be improved. Further, with the number of avalanche photodiodes in the active state being the same in a plurality of pixels of a pixel array, a uniform sensitivity of the pixels can be obtained, and the image quality can be improved.

Second Embodiment

Figure 9:
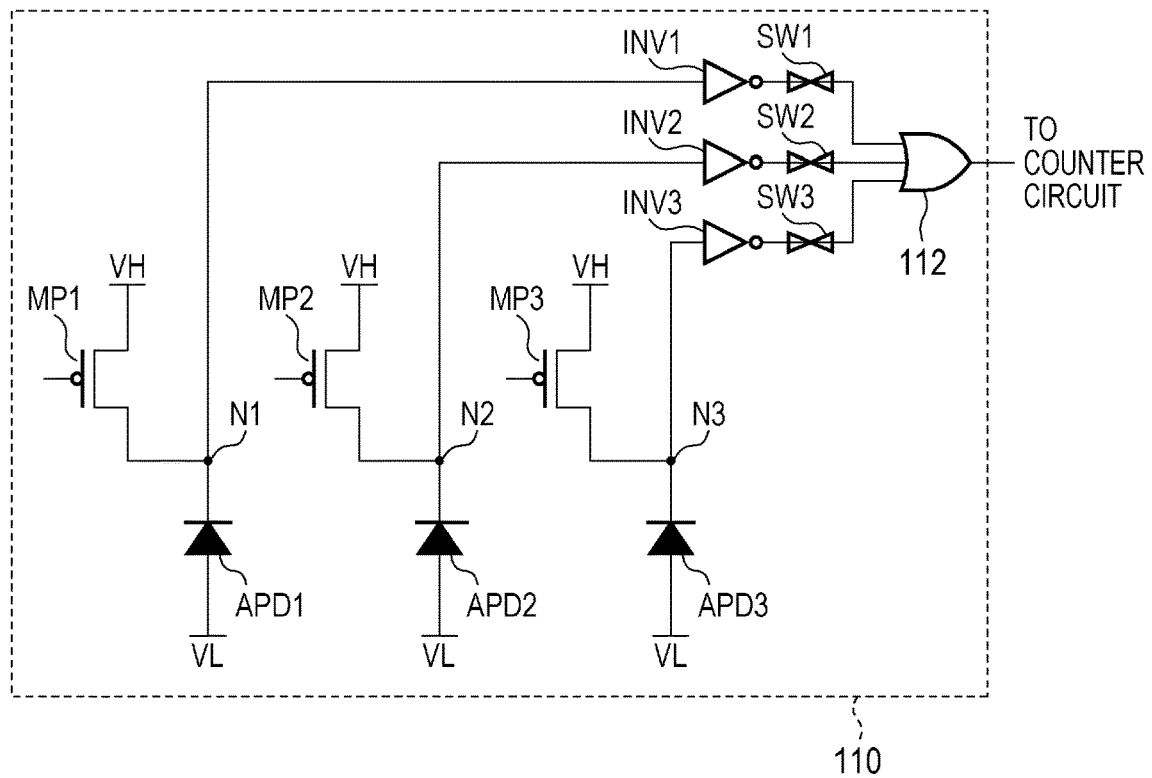
FIG. 9 is a circuit diagram illustrating a configuration example of a photoelectric conversion signal generation unit of the pixel of the imaging device according to a second embodiment of the present invention.

An imaging device and a method of driving the same according to a second embodiment of the present invention will be described with reference to FIG. 9. Similar components to those of the imaging device according to the first embodiment are labeled with the same reference symbols, and the description thereof will be omitted or simplified. FIG. 9 is a circuit diagram illustrating a configuration example of a photoelectric conversion signal generation unit of a pixel of the imaging device according to the present embodiment.

The imaging device according to the present embodiment is similar to the imaging device according to the first embodiment except a difference in the configuration of the photoelectric conversion signal generation unit 110. That is, as illustrated in FIG. 9, the photoelectric conversion signal generation unit 110 of the imaging device according to the present embodiment does not have the re-channel MOS transistors MN1, MN2, and MN3 as the gain control switch. Instead, switches SW1, SW2, and SW3 are provided between the inverter circuits INV1, INV2, and INV3 and the OR circuit 112. The switches SW1, SW2, and SW3 can be controlled by the gain control signals φG1, φG2, and φG3, respectively. For example, when the gain control signal φG is at a high level, the corresponding switch SW is in an on-state, and when the gain control signal φG is at a low level, the corresponding switch SW is in an off-state.

In the present embodiment, a reverse bias voltage of 53.3 V that is the potential difference between the voltage VH and the voltage VL is always applied to the avalanche photodiodes APD, and all the avalanche photodiodes APD always operate in the Geiger mode. Thus, when the number of incident photons is large, the signal pulses output from the inverter circuits INV1, INV2, and INV3 are as illustrated in FIG. 7B, for example.

However, the switches SW1, SW2, and SW3 are provided between the inverter circuits INV1, INV2, and INV3 and the OR circuit 112, and any of the inverter circuits INV can be selected to be connected to the OR circuit 112. For example, when the switch SW2 is set to an on-state and the switches SW1 and SW3 are set to an off-state, only the signal pulse output from the inverter circuit INV2 is input to the OR circuit 112. Thereby, the number of signal pulses output from the OR circuit 112 will be equal to four that is the number of signal pulses output from the inverter circuit INV2, which allows for accurate photon-counting. Thereby, the same advantages as obtained in the first embodiment can be realized.

The switches SW are not necessarily required to be provided between the inverter circuits INV and the OR circuit 112, and may be provided between the cathode terminals (nodes N) of the avalanche photodiodes APD and the inverter circuits INV. In this case, any of the avalanche photodiodes APD can be selected to be connected to the OR circuit 112 via the inverter circuits INV, the same effects and advantages as obtained in the circuit of FIG. 9 can be realized.

In such a way, the switches SW are switches that switch connection and disconnection between the avalanche photodiodes APD and the OR circuit 112. In other words, the switches SW form a setting unit adapted to separately set a plurality of avalanche photodiodes to the active state or the inactive state. Note that the OR circuit 112 can be considered as a part of the counter circuit 120. In this case, it can be said that the switches SW are switches that switch connection and disconnection between the avalanche photodiodes APD and the counter circuit 120.

Note that, when the connection between the avalanche photodiode APD and the OR circuit 112 is opened by the switch SW, the output side terminal of the switch SW is in a floating state. For example, in the circuit configuration of FIG. 9, of the OR circuit 112, an input terminal connected to the switch SW which is in an off-state of the input terminals is in a floating state. When the potential of this input terminal fluctuates due to a disturbance or the like, this may affect the output signal of the OR circuit 112 resulting in inaccurate photon-counting.

Therefore, in the case of the configuration in which the switches SW are provided between the avalanche photodiodes APD and the OR circuit 112 as described in the present embodiment, it is desirable that the terminal on output side of the switch SW which is in an off-state be fixed to a predetermined potential. For example, in the case of the circuit configuration of FIG. 9, the potential of the input terminal of the OR circuit 112 connected to the switch SW which is in an off-state is fixed to a low level.

As discussed above, according to the present embodiment, since each pixel is formed of a plurality of avalanche photodiodes and the plurality of avalanche photodiodes are separately set in the active state or the inactive state, the flexibility of setting of the photoelectric conversion gain can be improved. Further, with the number of avalanche photodiodes in the active state being the same in a plurality of pixels of a pixel array, a uniform sensitivity of the pixels can be obtained, and the image quality can be improved.

Third Embodiment

Figure 10A:
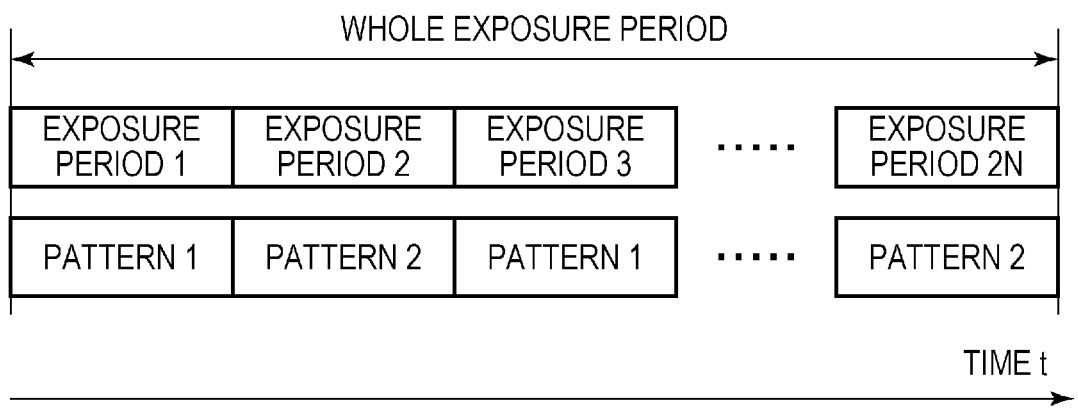
FIG. 10A, FIG. 10B, and FIG. 10C are diagrams illustrating a method of driving an imaging device according to a third embodiment of the present invention.
Figure 10B:
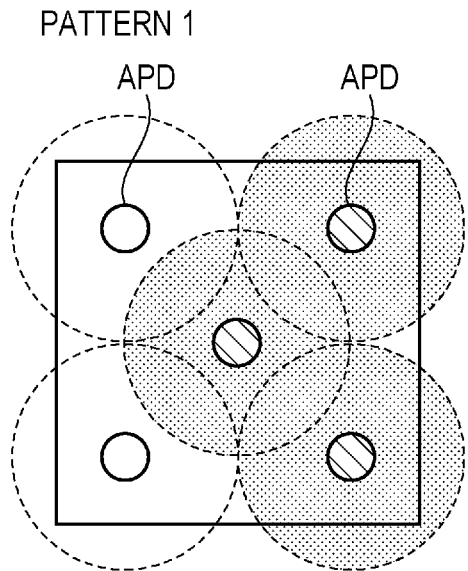
Figure 10C:
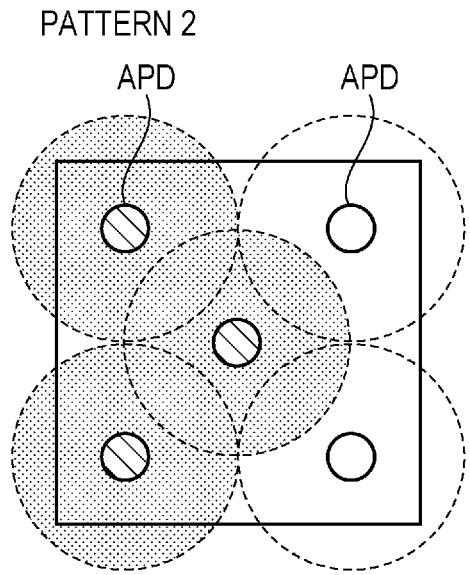

A method of driving an imaging device according to a third embodiment of the present invention will be described with reference to FIG. 10A to FIG. 10C. Similar components to those of the imaging device according to the first and second embodiments are labeled with the same reference symbols, and the description thereof will be omitted or simplified. FIG. 10A to FIG. 10C are diagrams illustrating the method of driving the imaging device according to the present embodiment.

In the present embodiment, another method of driving the imaging device according to the first or second embodiment will be described. The configuration of the imaging device is the same as the imaging device of the first or second embodiment.

In the method of driving the imaging device according to the present embodiment, the arrangement of the avalanche photodiodes APD set to the active state and the avalanche photodiodes APD set to the inactive state within each one pixel is changed with time.

FIG. 10A schematically illustrates a view in which a whole exposure period for acquiring one image is divided into 2N periods (N is an integer), and the divided exposure period 1, exposure period 2, exposure period 3, and exposure period 2N are sequentially performed according to elapsing of time t. The references "pattern 1" and "pattern 2" depicted under each exposure period represent arrangement pattern of the avalanche photodiodes APD in the active state and the avalanche photodiodes APD in the inactive state in the corresponding exposure period. That is, the pattern 1 is employed in the exposure period 1, and the pattern 2 is employed in the exposure period 2. The pattern 1 and the pattern 2 are employed in an alternating manner in the subsequent exposure period.

FIG. 10B and FIG. 10C illustrate specific examples of the pattern 1 and the pattern 2. FIG. 10B and FIG. 10C are plan views of the semiconductor substrate 210 viewed from the first face 212 side, which illustrate five avalanche photodiodes APD of one pixel 12 that are arranged inside the n-type semiconductor region 224. In FIG. 10B and FIG. 10C, hatched circles represent the avalanche photodiodes APD in the active state, and white circles represent the avalanche photodiodes APD in the inactive state. Each circle depicted with a dotted line about each avalanche photodiode APD is schematic illustration of a range of the photon that can be collected by the avalanche photodiode APD present at the center. In the actual implementation, the intermediate part between the avalanche photodiodes APD is an approximate ridge of the potential, and photons within the region surrounded by the ridges converge at each avalanche photodiode APD.

In the pattern 1, two right-side avalanche photodiodes APD in addition to the center avalanche photodiode APD are set to the active state, and thereby the pattern 1 provides an operation to facilitate detection of photons incident at the right-side region. On the other hand, in the pattern 2, two left-side avalanche photodiodes APD in addition to the center avalanche photodiode APD are set to the active state, and thereby the pattern 2 provide an operation to facilitate detection of photons incident at the left-side region.

When a part of the plurality of avalanche photodiodes APD included in one pixel 12 is set to the active state, a state may occur where photons are detected in a particular region within a pixel region. In such a case, with arrival positions of a light to the pixels 12 being unbalance, the number of photons incident at the pixel 12 may not be accurately counted. For example, in an area-type sensor, the light incident angle may be different between the left side and the right side in the pixels 12 in the left-side and the right-side circumferential portions of the screen, which may cause unbalanced arrival positions of a light to the pixels 12.

The whole exposure period is divided into a plurality of exposure periods and the pattern of the avalanche photodiodes APD to be set to the active state/the inactive state for respective exposure periods is changed, and thereby an average signal output can be obtained even with the unbalance arrival position of a light to the pixels 12.

The number or the arrangement of the avalanche photodiodes APD in the active state in respective divided exposure periods is not limited to the example described above. For example, the number of avalanche photodiodes APD included in each one pixel 12 is not limited to five. Further, while the example in which the detection area is switched in a lateral direction for respective exposure periods has been described in the present embodiment, the detection area may be switched in a vertical direction or in a diagonal direction. Further, the plurality of avalanche photodiodes APD included in each one pixel 12 may be operated separately one by one. Further, while two types of patterns are repeated in the present embodiment, three or more types of patterns may be repeated.

As discussed above, according to the present embodiment, since the arrangement of the avalanche photodiodes set in the active state within each one pixel during an exposure period for acquiring one image is switched, it is possible to suppress unbalanced arrival positions of a light to the pixels from affecting the image quality.

Fourth Embodiment

A method of driving an imaging device according to a fourth embodiment of the present invention will be described with reference to FIG. 11A to FIG. 11D. Similar components to those of the imaging device according to the first to third embodiments are labeled with the same reference symbols, and the description thereof will be omitted or simplified. FIG. 11A to FIG. 11D are diagrams illustrating the method of driving the imaging device according to the present embodiment.

In the present embodiment, another method of driving the imaging device according to the first or second embodiment will be described. The configuration of the imaging device is the same as the imaging device of the first or second embodiment.

In the method of driving the imaging device according to the present embodiment, the arrangement of the avalanche photodiodes APD set to the active state and the avalanche photodiodes APD set to the inactive state within each one pixel is changed with time likewise the case of the third embodiment. In the present embodiment, however, the number of avalanche photodiodes APD set to the active state is changed in the divided exposure period, if necessary.

FIG. 11A schematically illustrates a view in which a whole exposure period for acquiring one image is divided into 3N periods (N is an integer), and the divided exposure period 1, exposure period 2, exposure period 3, . . . , and exposure period 3N are sequentially performed according to elapsing of time t. The references "pattern 1", "pattern 2", and "pattern 3" depicted under each exposure period represent arrangement pattern of the avalanche photodiodes APD in the active state and the avalanche photodiodes APD in the inactive state in the corresponding exposure period. That is, the pattern 1 is employed in the exposure period 1, the pattern 2 is employed in the exposure period 2, and the pattern 3 is employed in the exposure period 3. In the subsequent exposure periods, the pattern 1, the pattern 2, and the pattern 3 are repeatedly employed in this order.

FIG. 11B, FIG. 11C, and FIG. 11D illustrate specific examples of the pattern 1, the pattern 2, and the pattern 3. FIG. 11B, FIG. 11C, and FIG. 11D are plan views of the semiconductor substrate 210 viewed from the first face 212 side, which illustrate five avalanche photodiodes APD of one pixel that are arranged inside the n-type semiconductor region 224. In FIG. 11B, FIG. 11C, and FIG. 11D, hatched circles represent the avalanche photodiodes APD in the active state, and white circles represent the avalanche photodiodes APD in the inactive state. Each circle depicted with a dotted line about each avalanche photodiode APD is schematic illustration of a range of the photon that can be collected by the avalanche photodiode APD present at the center.

In the pattern 1, two right-side avalanche photodiodes APD in addition to the center avalanche photodiode APD, namely, three avalanche photodiodes APD in total are set to the active state. In the pattern 2, two left-side avalanche photodiodes APD in addition to the center avalanche photodiode APD, namely, three avalanche photodiodes APD in total are set to the active state. In the pattern 3, four avalanche photodiodes APD except the center avalanche photodiode APD, namely, four avalanche photodiodes APD in total are set to the active state. In other words, in the pattern 1 and the pattern 2, ⅗ of the five avalanche photodiodes APD are set to the active state. In the pattern 3, ⅘ of the five avalanche photodiodes APD are set to the active state.

The whole exposure period is divided into a plurality of exposure periods while the number of avalanche photodiodes APD in the active state for exposure is changed in such a way, which can improve the flexibility of setting of the sensitivity. For example, when the sensitivity with all the avalanche photodiodes APD being in active state is 1, it is possible to set the sensitivity to ½ or ⅓ thereof.

For example, when all the five avalanche photodiodes APD are set to the active state from the exposure period 1 to the exposure period 3, the total number of 15 avalanche photodiodes APD are set to the active state from the exposure period 1 to the exposure period 3. On the other hand, when the pattern 1 to the pattern 3 illustrated in FIG. 11B to FIG. 11D are employed as the patterns from the exposure period 1 to the exposure period 3, the total number of 10 avalanche photodiodes APD are set to the active state from the exposure period 1 to the exposure period 3.

Therefore, by setting the whole exposure period as illustrated in FIG. 11A, the sensitivity can be reduced to ⅔ compared to the case where all the five avalanche photodiodes APD are set to the active state. Such an operation allows for sensitivity setting such as "−⅓ steps", for example, similarly to the ISO sensitivity setting in a camera.

As discussed above, according to the present embodiment, since the number and the arrangement of the avalanche photodiodes set in the active state within each one pixel during an exposure period for acquiring one image are switched, the flexibility of the sensitivity setting of the pixel can be improved. This allows the sensitivity of the pixel to be set suitably in accordance with the ISO sensitivity setting of a camera.

Fifth Embodiment

Figure 12:
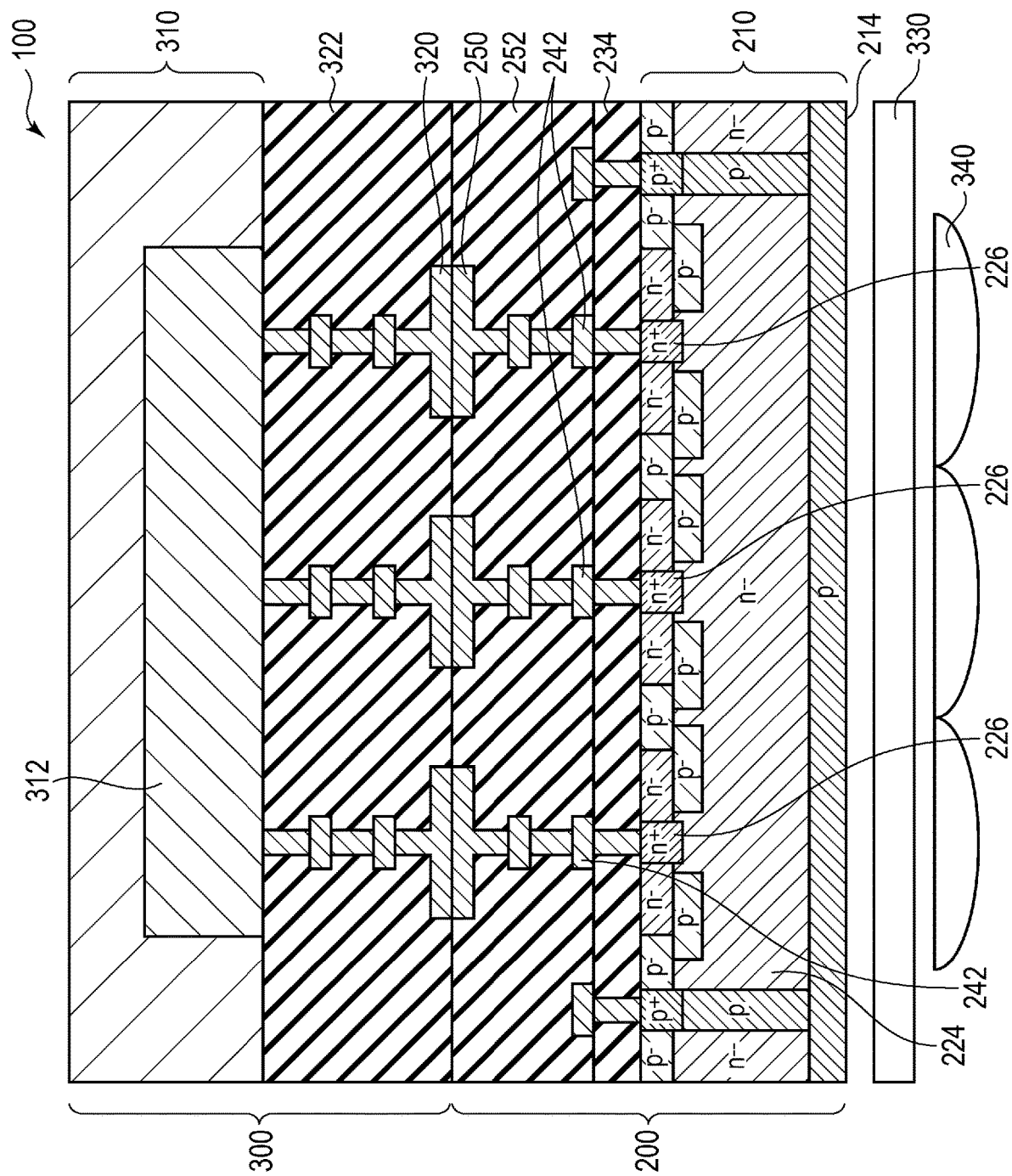
FIG. 12 is a cross-sectional view illustrating a general configuration of an imaging device according to a fifth embodiment of the present invention.

An imaging device according to a fifth embodiment of the present invention will be described with reference to FIG. 12. Similar components to those of the imaging device according to the first to fourth embodiments are labeled with the same reference symbols, and the description thereof will be omitted or simplified. FIG. 12 is a cross-sectional view illustrating the general configuration of the imaging device according to the present embodiment.

As previously described, the imaging device 100 of the present invention can be formed by attaching a substrate in which the avalanche photodiodes APD are provided and a substrate in which other components than the avalanche photodiodes APD are provided, for example. In the present embodiment, an example of the imaging device 100 formed including the substrate in which the avalanche photodiodes APD are provided and the substrate in which other components than the avalanche photodiodes APD are provided will be illustrated.

As illustrated in FIG. 12, the imaging device 100 includes the substrate 200 in which the avalanche photodiodes APD are provided and the substrate 300 in which other components than the avalanche photodiodes APD are provided. The substrate 200 is a substrate in which a plurality of interconnection layers are further formed if necessary on the insulating film 234 arranged over the semiconductor substrate 210. Interconnections 250 in the uppermost layer provided in the substrate 200 are electrically connected to the interconnections 242 via a plurality of interconnections or contact plugs arranged inside the insulating film 252. The substrate 300 is a substrate in which a plurality of interconnection layers are formed on the semiconductor substrate 310 in which a control unit 312 including other components than the avalanche photodiodes APD is provided. The interconnections 320 in the uppermost layer provided in the substrate 300 are electrically connected to the control unit 312 via a plurality of interconnections or contact plugs arranged inside the insulating film 322. The substrate 200 and the substrate 300 are attached such that the interconnections 250 of the substrate 200 and the interconnections 320 of the substrate 300 are connected to each other.

A color filter 330 and microlenses 340 are arranged on the second face 214 side of the semiconductor substrate 210. The embodiment is configured such that the light entering the imaging device 100 passes through the microlenses 340 and the color filter 330 and enters the n-type semiconductor region 224 from the second face 214 side of the semiconductor substrate 210. That is, in the present embodiment, the avalanche photodiode APD is configured as the backside illumination type.

In the present embodiment, since the components other than the avalanche photodiodes APD are arranged in the substrate 300 separate from the substrate 200 in which the avalanche photodiodes APD are provided, the flexibility of the arrangement of the avalanche photodiodes APD is improved. Thereby, the aperture ratio of the avalanche photodiodes APD can be easily increased, and thus the light detection efficiency can be improved.

Note that, while the avalanche photodiodes APD are configured as backside illumination type in the present embodiment, configuration of a front side illumination type may be employed. However, the backside illumination type is preferred to the front side illumination type, because charges generated near the surface of the substrate (on the light incidence side) can be detected at a higher efficiency and therefore a higher light detection efficiency can be realized in a broad wavelength band from a short wavelength to a long wavelength in the backside illumination type than in the front side illumination type.

Sixth Embodiment

Figure 13:
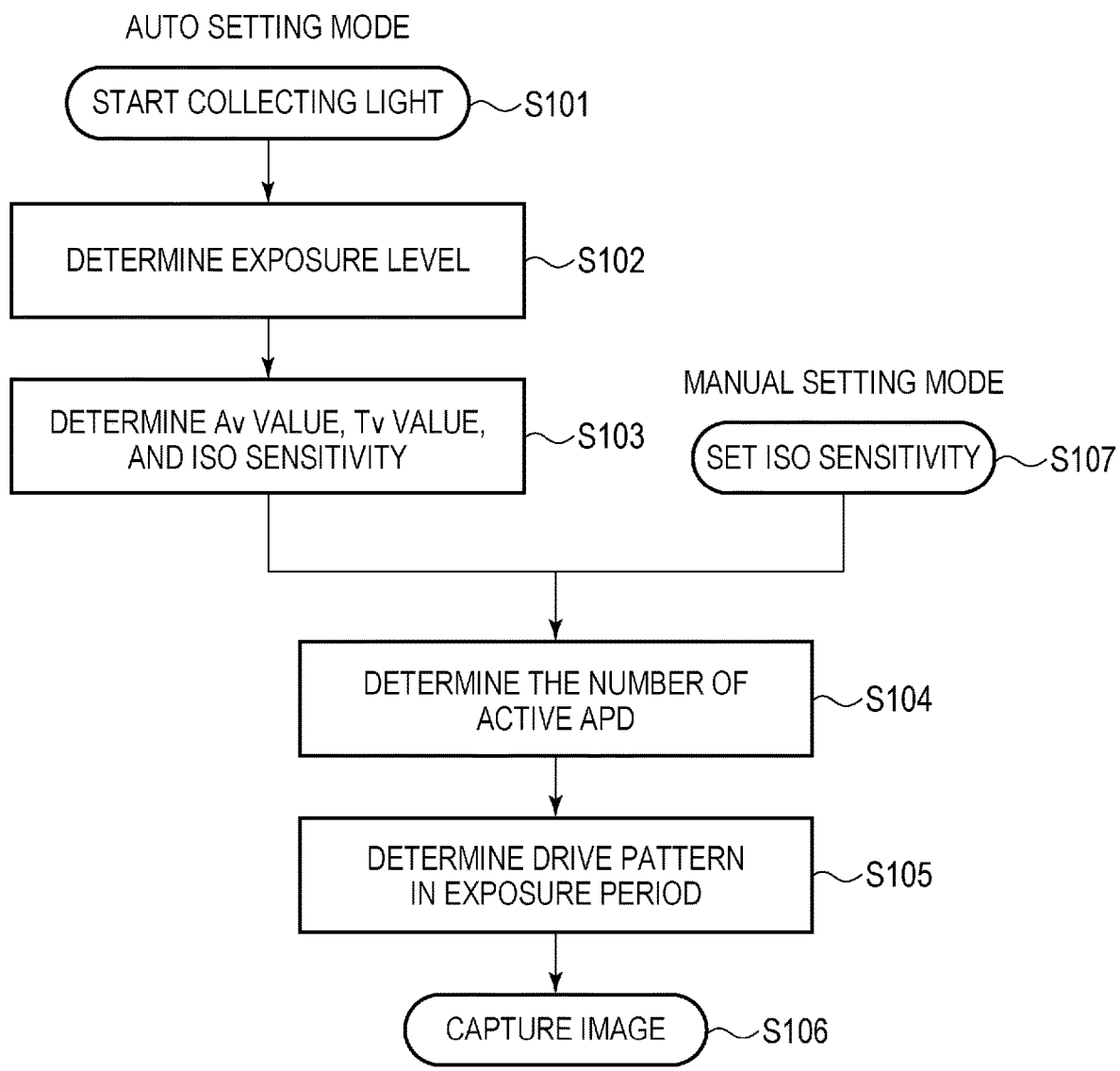
FIG. 13 and FIG. 14 are flowcharts illustrating a method of driving an imaging device according to a sixth embodiment of the present invention.
Figure 14:
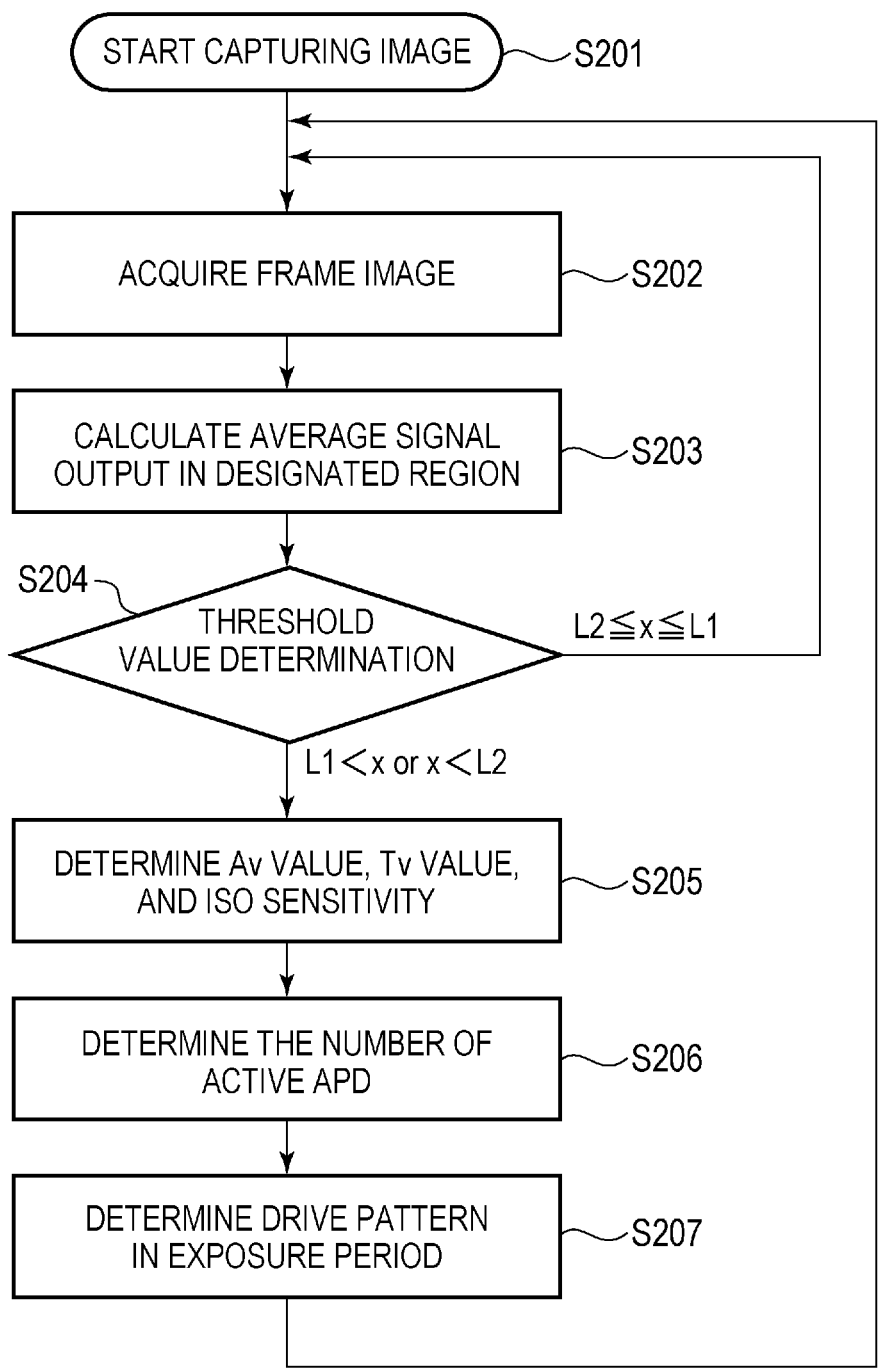

A method of driving an imaging device according to a sixth embodiment of the present invention will be described with reference to FIG. 13 and FIG. 14. Similar components to those of the imaging device according to the first to fifth embodiments are labeled with the same reference symbols, and the description thereof will be omitted or simplified. FIG. 13 and FIG. 14 are flowcharts illustrating the method of driving the imaging device according to the present embodiment.

The imaging device described in the first to fifth embodiments can be applied to various imaging systems as illustrated in the embodiments described later. In the present embodiment, an example of driving the imaging device when any of the imaging devices described in the first to fifth embodiments is applied to an imaging system will be described.

FIG. 13 is a control flow of the imaging device in an imaging system having a function of capturing a static image as represented by a digital single-lens reflex camera.

A digital single-lens reflex camera mounts an AE sensor or the like in addition to the imaging device therein and has an auto setting mode that references a setting table or the like included in the camera in accordance with the amount of a collected light and determines an aperture value of a lens, exposure time, or an ISO sensitivity setting. Further, a digital single-lens reflex camera has a manual setting mode that determines photographing conditions in accordance with settings by the user.

In the auto setting mode, first, in step S101, a light receiving element such as an AE sensor is used to determine the brightness of a scene.

Next, in step S102, an exposure level is determined based on the brightness of the scene determined in step S101.

Next, in step S103, a setting table in the camera is referenced to set setting values of the aperture value of the lens (Av value), the shutter speed (Tv value), and the ISO sensitivity to the optimal values in accordance with the exposure level determined in step S102.

Next, in step S104, out of a plurality of avalanche photodiodes APD included in each one pixel, the number of avalanche photodiodes APD to be set to the active state is set in accordance with the ISO sensitivity set in step S103.

Next, in step S105, the drive pattern in the exposure period is set in accordance with the shutter speed (Tv value) set in step S103 and the number of avalanche photodiodes APD to be set to the active state set in step S104.

Next, in step S106, actual capturing is performed.

On the other hand, in the manual setting mode, in step S107, setting entry of any ISO sensitivity is accepted through a button operation or the like by the user. Then, actual capturing is performed in a similar manner to step S104 to step S106 described above.

FIG. 14 is a control flow in an imaging system having a function of continuously acquiring an image while performing sensitivity control following a change in the brightness of a scene, such as when capturing a motion image by a video camera, for example.

In light collection using an AE sensor as applied in capturing a static image, since a light path of an incident light on a camera needs to be changed and guided to a light receiving element, light collection cannot be made when the signals are required to be continuously output such as when a motion image is captured. Thus, in capturing a motion image, the signal level of a captured frame image is determined to change a setting on and after the next frame if necessary.

In step S201, upon the start of capturing, the first frame image is acquired in the subsequent step S202.

Next, in step S203, an average signal output x is calculated that is an averaged signal level of the pixels in a designated region of the acquired frame image, for example, a region of 100 pixels by 100 pixels at the center portion.

Next, in step S204, threshold value determination of the average signal output x is performed. Specifically, it is determined whether or not the average signal output x is within a range between the lower limit value L2 and the upper limit value L1 of a predefined signal level.

As a result, if the average signal output x is within the range between the lower limit value L2 and the upper limit value L1 (L2≤x≤L1), it is determined that the exposure is appropriate and no change is necessary in the exposure setting, and the process returns to step S202 to acquire a frame image of the next frame.

On the other hand, overexposure is determined if the average signal output x is greater than the upper limit value L1 (L1<x), while underexposure is determined if the average signal output x is less than the lower limit value L2 (x<L2), and step S205 is entered.

In step S205, based on the determination result of the exposure in step S204, setting values of the aperture value of the lens (Av value), a shutter speed (Tv value), and an ISO sensitivity are set to the optimal value.

Next, in step S206, out of a plurality of avalanche photodiodes APD included in each one pixel, the number of avalanche photodiodes APD to be set to the active state is set in accordance with the ISO sensitivity set in step S205.

Next, in step S207, the drive pattern in the exposure period is set in accordance with the shutter speed (Tv value) set in step S205 and the number of avalanche photodiodes APD to be set to the active state set in step S207. Then, the process returns to step S202 to acquire a frame image of the next frame.

Note that, while the exposure is controlled for each frame of a motion image according to the above flow, it is possible to perform such an operation that the exposure setting is re-set once for capturing of 10 frames, for example, in the actual implementation.

Seventh Embodiment

Figure 15:
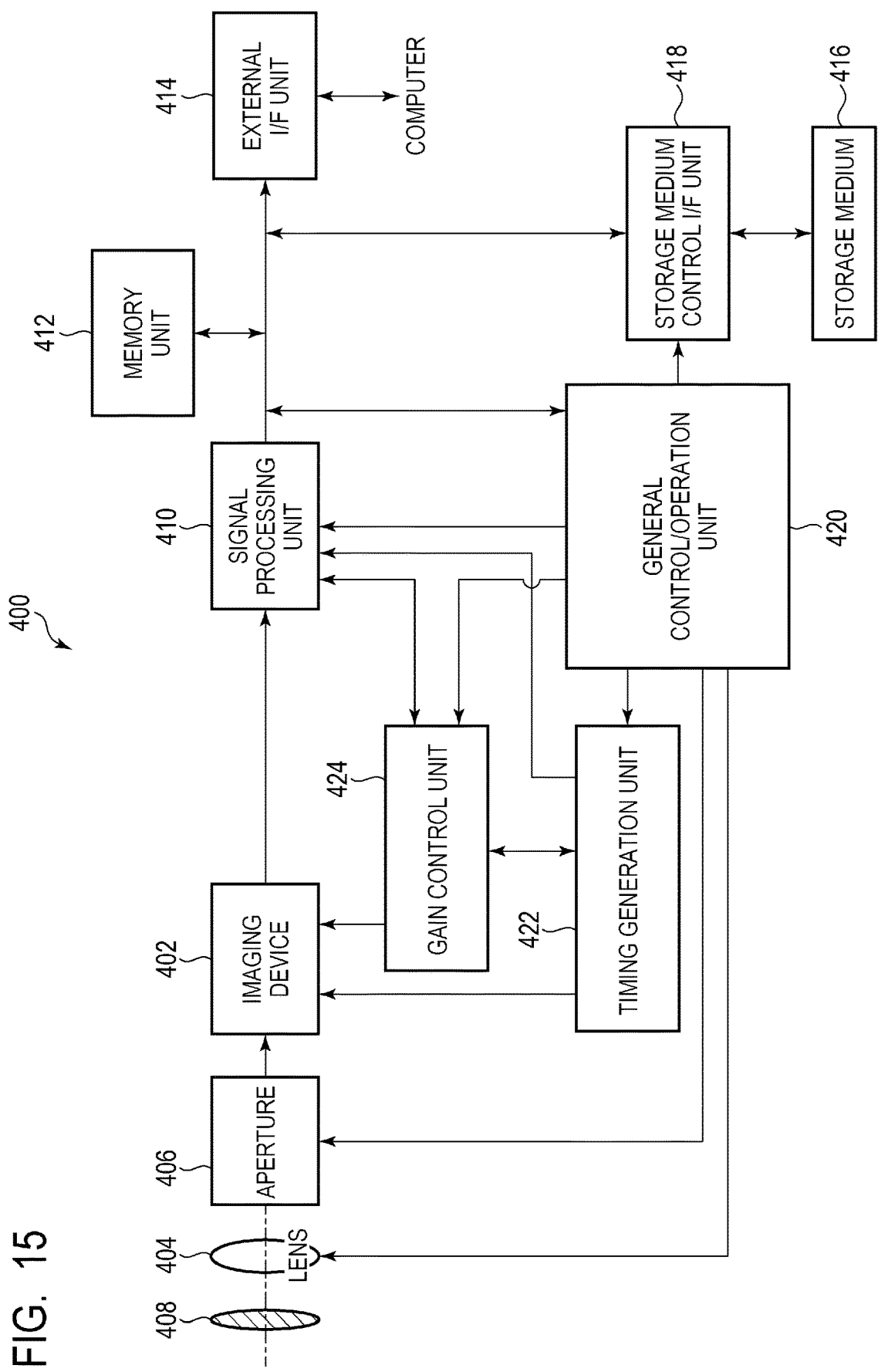
FIG. 15 is a block diagram illustrating a general configuration of an imaging system according to a seventh embodiment of the present invention.

An imaging system according to a seventh embodiment of the present invention will be described with reference to FIG. 15. Similar components to those of the imaging device according to the first to sixth embodiments are labeled with the same reference symbols, and the description thereof will be omitted or simplified. FIG. 15 is a block diagram illustrating a general configuration of the imaging system according to the present embodiment.

The imaging devices 100 described in the above first to sixth embodiments can be applied to various imaging systems. Examples of the applicable imaging systems may include a digital still camera, a digital camcorder, a surveillance camera, a copy machine, a fax machine, a mobile phone, an on-vehicle camera, an observation satellite, and the like. Further, a camera module having an optical system, such as a lens, and an imaging device may be included in the imaging system. FIG. 15 illustrates a block diagram of a digital still camera as an example of the above.

The imaging system 400 illustrated as an example in FIG. 15 includes an imaging device 402, a lens 404 that captures an optical image of an object onto the imaging device 402, an aperture 406 for changing a light amount passing through the lens 404, and a barrier 408 for protecting the lens 404. The lens 404 and the aperture 406 form an optical system that converges a light onto the imaging device 402. The imaging device 402 is the imaging device 100 described in the first to sixth embodiments and converts an optical image captured by the lens 404 into image data.

The imaging system 400 further includes a signal processing unit 410 that processes an output signal output from the imaging device 402. The signal processing unit 410 performs AD conversion that converts an analog signal output from the imaging device 402 into a digital signal. Further, the signal processing unit 410 performs other operations of performing various correction or compression if necessary and outputting image data. An AD conversion unit that is a part of the signal processing unit 410 may be formed on the semiconductor substrate (for example, semiconductor substrate 310) in which the imaging device 402 is provided, or may be formed on a different semiconductor substrate from the imaging device 402. Further, the imaging device 402 and the signal processing unit 410 may be formed on the same semiconductor substrate.

The imaging system 400 further includes a memory unit 420 for temporarily storing image data therein and an external interface unit (external I/F unit) 414 for communicating with an external computer or the like. The imaging system 400 further includes a storage medium 416 such as a semiconductor memory for performing storage or readout of image pickup data and a storage medium control interface unit (storage medium control I/F unit) 418 for performing storage or readout on the storage medium 416. Note that the storage medium 416 may be embedded in the imaging system 400 or may be removable.

The imaging system 400 further includes a general control/operation unit 420, a timing generation unit 422, and a gain control unit 424. The general control/operation unit 420 performs various computation and controls the entire digital still camera. The timing generation unit 422 outputs various timing signals to the imaging device 402 and the signal processing unit 410. The gain control unit 424 controls the gain setting of the imaging device 402 and serves to convey the gain setting information to the signal processing unit 410 and the timing generation unit 422. Here, the timing signal or the like may be input from the outside, and the imaging system 400 may have at least the imaging device 402 and the signal processing unit 410 that processes an output signal output from the imaging device 402.

The imaging device 402 outputs an imaging signal to the signal processing unit 410. The signal processing unit 410 performs predetermined signal processing on an imaging signal output from the imaging device 402 and outputs image data. Further, the signal processing unit 410 uses an imaging signal to generate an image.

Application of the imaging device 100 of any of the first to sixth embodiments can realize an imaging system that can acquire a good quality image with a wide range of the brightness.

Eighth Embodiment

Figure 16A:
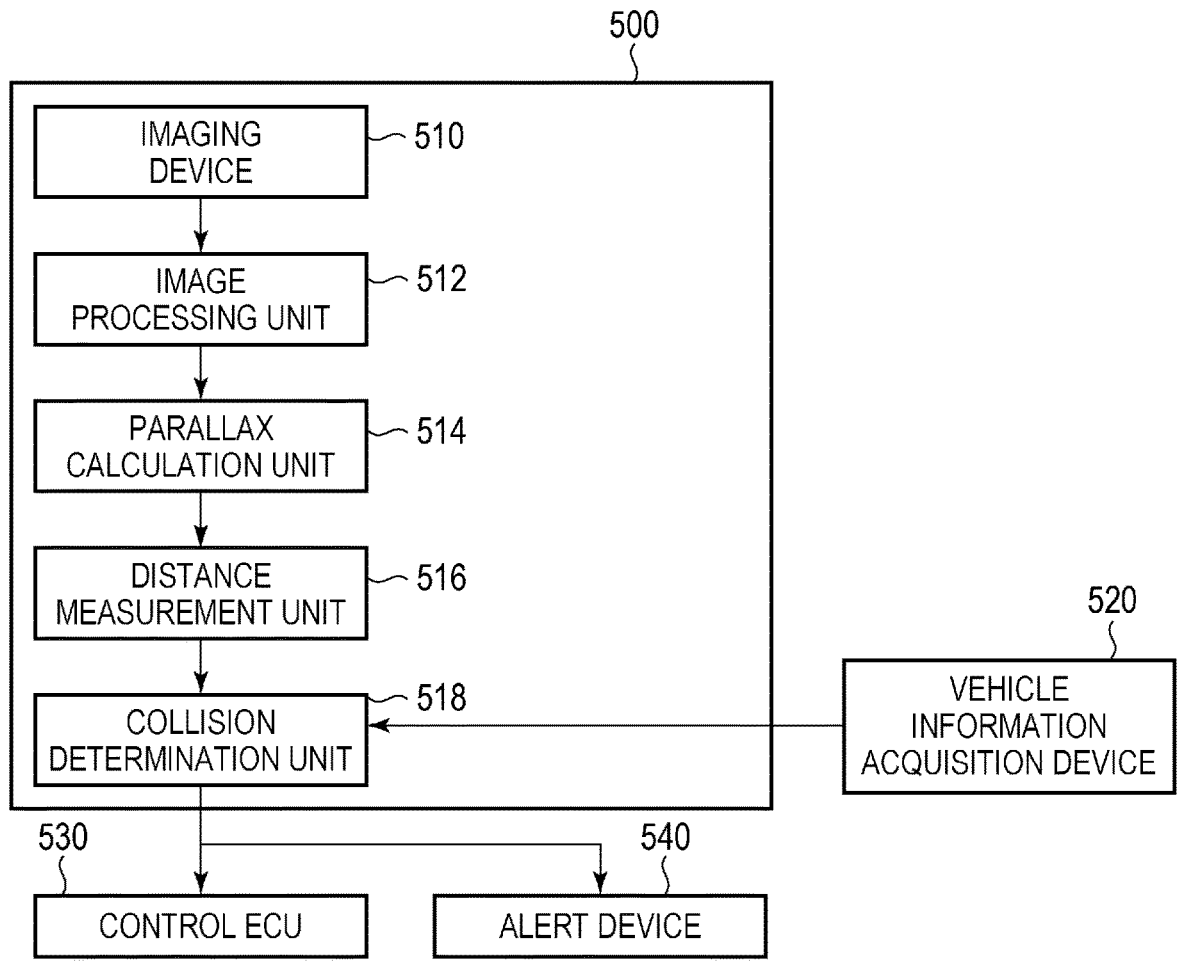
FIG. 16A is a diagram illustrating a configuration example of an imaging system according to an eighth embodiment of the present invention.
Figure 16B:
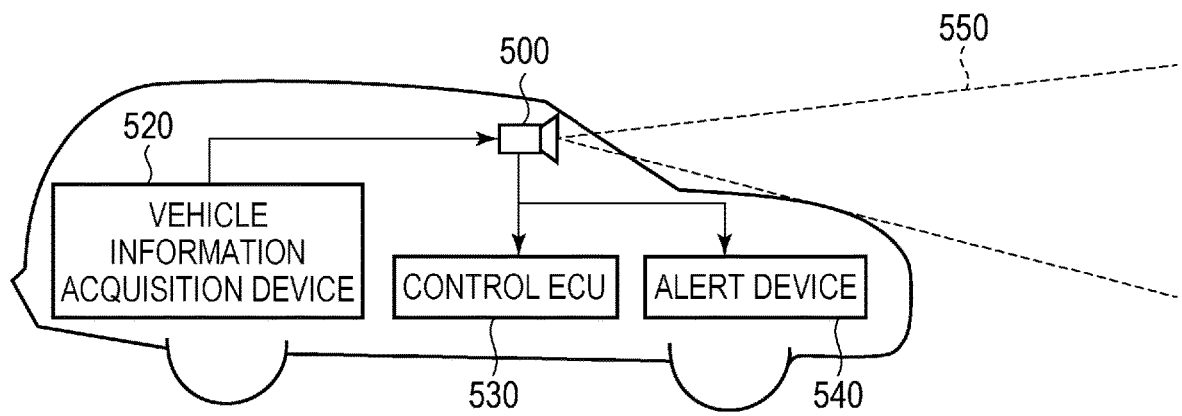
FIG. 16B is a diagram illustrating a configuration example of a moving unit according to the eighth embodiment of the present invention.

An imaging system and a movable object according to an eighth embodiment of the present invention will be described by using FIG. 16A and FIG. 16B. FIG. 16A is a diagram illustrating a configuration example of the imaging system according to the present embodiment. FIG. 16B is a diagram illustrating a configuration example of the movable object according to the present embodiment.

FIG. 16A illustrates an example of the imaging system regarding an on-vehicle camera. The imaging system 500 includes an imaging device 510. The imaging device 510 is any of the imaging devices 100 described in the above first to sixth embodiments. The imaging system 500 includes an image processing unit 512 that performs image processing on a plurality of image data acquired by the imaging device 510 and a parallax calculation unit 514 that calculates a parallax (a phase difference of parallax images) from the plurality of image data acquired by the imaging system 500. Further, the imaging system 500 includes a distance measurement unit 516 that calculates a distance to the object based on the calculated parallax and a collision determination unit 518 that determines whether or not there is a collision possibility based on the calculated distance. Here, the parallax calculation unit 514 and the distance measurement unit 516 are an example of a distance information acquisition unit that acquires distance information on the distance to the object. That is, the distance information is information on a parallax, a defocus amount, a distance to an object, or the like. The collision determination unit 518 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 500 is connected to the vehicle information acquisition device 520 and can acquire vehicle information such as a vehicle speed, a yaw rate, a steering angle, or the like. Further, the imaging system 500 is connected with a control ECU 530, which is a control device that outputs a control signal for causing a vehicle to generate braking force based on a determination result by the collision determination unit 518. Further, the imaging system 500 is connected with an alert device 540 that issues an alert to the driver based on a determination result by the collision determination unit 518. For example, when the collision probability is high as the determination result of the collision determination unit 518, the control ECU 530 performs vehicle control to avoid a collision or reduce damage by applying a brake, pushing back an accelerator, suppressing engine power, or the like. The alert device 540 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 500. FIG. 16B illustrates the imaging system in a case of capturing a front area of a vehicle (a capturing area 550). The vehicle information acquisition device 520 transmits instructions to the imaging system 500 or the imaging device 510. Such a configuration can further improve the ranging accuracy.

Although the example of control for avoiding a collision to another vehicle has been illustrated in the above description, the embodiment is applicable to automatic driving control for following another vehicle, automatic driving control for not going out of a traffic lane, or the like. Furthermore, the imaging system 500 is not limited to a vehicle such as the subject vehicle, and can be applied to a movable object (moving apparatus) such as a ship, an airplane, or an industrial robot, for example. In addition, the imaging system 500 can be widely applied to any device which utilizes object recognition, such as an intelligent transportation system (ITS), without being limited to movable objects.

Modified Embodiments

The present invention is not limited to the above-described embodiments, but various modifications are possible.

For example, the embodiment of the present invention includes an example in which a part of the configuration of any of the embodiments is added to another embodiment and an example in which a part of the configuration of any of the embodiments is replaced with a part of the configuration of another embodiment.

Further, the avalanche photodiode illustrated in FIG. 4 is an example, and the structure of the avalanche photodiode applicable to the present invention is not limited to that illustrated in FIG. 4. Further, the characteristic of the avalanche photodiode is not limited to that illustrated in FIG. 5. Each voltage of the power source that drives the avalanche photodiode has to be selected as appropriate in accordance with the characteristic of the avalanche photodiode.

Further, while a plurality of avalanche photodiodes APD in each one pixel are arranged within each one n-type semiconductor region 224 in the embodiments described above, each of the avalanche photodiodes APD may be arranged within a separate n-type semiconductor region 224.

Further, the imaging systems illustrated in the seventh and eighth embodiments are illustrated as an exemplary imaging system to which the imaging device of the present invention can be applied, and imaging systems to which the imaging device of the present invention can be applied are not limited to the configurations illustrated in FIG. 15 to FIG. 16B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-052956, filed Mar. 17, 2017, which is hereby incorporated by reference herein in its entirety.

What is claimed is:

1. An imaging device comprising:
a plurality of pixels each including a plurality of avalanche photodiodes, a setting circuit configured to set each of the plurality of avalanche photodiodes to an active state or an inactive state, and a counter circuit that counts a signal output from the avalanche photodiode(s) set to the active state out of the plurality of avalanche photodiodes,
wherein the imaging device is configured to change the number of avalanche photodiodes set to the active state out of the plurality of avalanche photodiodes, in accordance with brightness of an object.

2. The imaging device according to claim 1, wherein the setting circuit comprises a switch that switches a voltage applied to each of the plurality of avalanche photodiodes to a voltage that is higher than a breakdown voltage of each of the plurality of avalanche photodiodes or a voltage that is lower than or equal to the breakdown voltage.

3. The imaging device according to claim 1, wherein the setting circuit comprises a switch that switches connection and disconnection between each of the plurality of avalanche photodiodes and the counter circuit.

4. The imaging device according to claim 1 further comprising:
a control circuit configured to receive a control signal in accordance with brightness of an object and control the setting circuit in accordance with the received control signal.

5. The imaging device according to claim 4, wherein the control circuit controls the number of the avalanche photodiodes set to the active state in accordance with the control signal.

6. The imaging device according to claim 4, wherein the control circuit switches an arrangement of one or more of the plurality of avalanche photodiodes set to the active state in an exposure period for acquiring an image.

7. The imaging device according to claim 6, wherein a first avalanche photodiode of the plurality of avalanche photodiodes is in the active state in a first frame period, and the first avalanche photodiode is in the inactive state in a second frame period.

8. The imaging device according to claim 4, wherein the control circuit switches the number of avalanche photodiodes set to the active state in an exposure period for acquiring an image.

9. The imaging device according to claim 1 further comprising an isolation portion provided between a region in which the plurality of avalanche photodiodes of one pixel are provided and a region in which the plurality of avalanche photodiodes of another pixel are provided.

10. The imaging device according to claim 1, wherein an arrangement of one or more of the plurality of avalanche photodiodes set to the active state is different between one pixel and another pixel included in the plurality of pixels.

11. The imaging device according to claim 1, wherein the number of avalanche photodiodes set to the active state out of the plurality of avalanche photodiodes is same in the plurality of pixels.

12. An imaging system comprising:
the imaging device according to claim 1; and
a signal processing unit that processes a signal output from the plurality of pixels of the imaging device.

13. The imaging system according to claim 12 further comprising a control circuit that sets the number of avalanche photodiodes set to the active state out of the plurality of avalanche photodiodes in accordance with brightness of an object.

14. A movable object comprising:
the imaging device according to claim 1;
a distance information acquisition unit adapted to acquire distance information of a distance to an object, from parallax images based on a signal from the imaging device; and
a control circuit configured to control the movable object based on the distance information.

15. The imaging device according to claim 1, further comprising a first substrate and a second substrate,
wherein the first substrate including the plurality of avalanche photodiodes and the second substrate including the counter circuit are stacked.

16. A method of driving an imaging device comprising a plurality of pixels each including a plurality of avalanche photodiodes, a setting circuit configured to set the plurality of avalanche photodiodes to an active state or an inactive state separately, and a counter circuit that counts a signal output from the avalanche photodiode(s) set to the active state out of the plurality of avalanche photodiodes, the method comprising:
in the plurality of pixels, setting the number of avalanche photodiodes set to the active state out of the plurality of avalanche photodiodes in accordance with brightness of an object.

17. The method of driving the imaging device according to claim 16, wherein an arrangement of one or more of the plurality of avalanche photodiodes set to the active state is switched in an exposure period for acquiring an image.

18. The method of driving the imaging device according to claim 16, wherein the number of avalanche photodiodes set to the active state is switched in an exposure period for acquiring an image.

19. A photoelectric conversion device comprising:
a plurality of photoelectric conversion units each including a plurality of avalanche photodiodes, a setting circuit configured to set each of the plurality of avalanche photodiodes to an active state or an inactive state, and a counter circuit that connects the plurality of avalanche photodiodes so as to input a signal from the plurality of avalanche photodiodes and count a signal output from the avalanche photodiode(s) set to the active state out of the plurality of avalanche photodiodes; and
an output line,
wherein the counter circuit of a first photoelectric conversion unit out of the plurality of photoelectric conversion units and the counter circuit of a second photoelectric conversion unit out of the plurality of photoelectric conversion units are connected to the output line,
wherein the photoelectric conversion device is configured to change the number of avalanche photodiodes set to the active state out of the plurality of avalanche photodiodes, and
wherein the setting circuit comprises a switch that switches a voltage applied to each of the plurality of avalanche photodiodes so that the avalanche photodiode is in the active state when an amplitude of a potential of the signal output from the avalanche photodiode is not less than a threshold value and switches the voltage so that the avalanche photodiode is in the inactive state when the amplitude of the potential of the signal output from the avalanche photodiode is less than the threshold value.

20. The photoelectric conversion device according to claim 19, wherein the switch switches connection and disconnection between each of the plurality of avalanche photodiodes and the counter circuit.

21. The photoelectric conversion device according to claim 19, wherein the setting circuit switches an arrangement of one or more of the plurality of avalanche photodiodes set to the active state in an exposure period for acquiring an image.

22. The photoelectric conversion device according to claim 19, wherein the setting circuit switches the number of avalanche photodiodes set to the active state in an exposure period for acquiring an image.

23. The photoelectric conversion device according to claim 19, wherein an isolation portion is provided between the first photoelectric conversion unit and the second photoelectric conversion unit.

24. The photoelectric conversion device according to claim 23, wherein the number of avalanche photodiodes set to the active state out of the plurality of avalanche photodiodes is different between the first photoelectric conversion unit and the second photoelectric conversion unit in an exposure period for acquiring an image.

25. The photoelectric conversion device according to claim 23, wherein the number of avalanche photodiodes set to the active state out of the plurality of avalanche photodiodes is same in the first photoelectric conversion unit and the second photoelectric conversion unit.

26. The photoelectric conversion device according to claim 19, further comprising a first substrate and a second substrate,
wherein the first substrate including the plurality of avalanche photodiodes and the second substrate including the counter circuit are stacked.

27. The imaging device according to claim 19, wherein a first avalanche photodiode of the plurality of avalanche photodiodes is in the active state in a first frame period, and the first avalanche photodiode is in the inactive state in a second frame period.

28. The imaging device according to claim 19, wherein the counter circuit counts the signal pulse based on an incident photon to the avalanche diode.

29. The imaging device according to claim 28,
wherein each of the plurality of photoelectric conversion units further includes an inverter circuit that connects the avalanche photodiode and the counter circuit, and
wherein the counter circuit counts the number of output pulses of the inverter circuit.

30. A photoelectric conversion device comprising:
a plurality of avalanche photodiodes; and
a counter circuit that counts a signal output from the avalanche photodiode(s) set to the active state out of the plurality of avalanche photodiodes,
wherein the photoelectric conversion device is configured to change the number of avalanche photodiodes set to the active state out of the plurality of avalanche photodiodes, in accordance with ISO sensitivity setting.

31. The photoelectric conversion device according to claim 30,
wherein each of a first pixel and a second pixel includes the plurality of avalanche photodiodes and the counter circuit, and
wherein an isolation portion is provided between the first pixel and the second pixel.

32. The photoelectric conversion device according to claim 31, wherein the number of avalanche photodiodes set to the active state out of the plurality of avalanche photodiodes is different between the first pixel and the second pixel in an exposure period for acquiring an image.

33. The photoelectric conversion device according to claim 31, wherein the number of avalanche photodiodes set to the active state out of the plurality of avalanche photodiodes is same in the first pixel and the second pixel.

34. The photoelectric conversion device according to claim 30, further comprising a first substrate and a second substrate, wherein the first substrate including the plurality of avalanche photodiodes and the second substrate including the counter circuit are stacked.

35. The imaging device according to claim 30, wherein a first avalanche photodiode of the plurality of avalanche photodiodes is in the active state in a first frame period, and the first avalanche photodiode is in the inactive state in a second frame period.

36. The photoelectric conversion device according to claim 30, wherein the setting circuit comprises a switch that switches a voltage applied to each of the plurality of avalanche photodiodes so that the avalanche photodiode is in the active state when an amplitude of a potential of the signal output from the avalanche photodiode is not less than a threshold value and switches the voltage so that the avalanche photodiode is in the inactive state when the amplitude of the potential of the signal output from the avalanche photodiode is less than the threshold value.

* * * * *